(12) United States Patent
Saito et al.

(10) Patent No.: US 6,807,094 B2
(45) Date of Patent: Oct. 19, 2004

(54) MAGNETIC MEMORY

(75) Inventors: Yoshiaki Saito, Kanagawa-ken (JP); Katsuya Nishiyama, Kanagawa-ken (JP); Shigeki Takahashi, Kanagawa-ken (JP); Minoru Amano, Kanagawa-ken (JP); Tomomasa Ueda, Kanagawa-ken (JP); Hiroaki Yoda, Kanagawa-ken (JP); Yoshiaki Asao, Kanagawa-ken (JP); Yoshihisa Iwata, Kanagawa-ken (JP); Tatsuya Kishi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/769,757

(22) Filed: Feb. 3, 2004

(65) Prior Publication Data

US 2004/0156232 A1 Aug. 12, 2004

Related U.S. Application Data

(63) Continuation of application No. 10/345,253, filed on Jan. 16, 2003, now Pat. No. 6,717,845.

(30) Foreign Application Priority Data

Jan. 16, 2002 (JP) ........................................ 2002-007877

(51) Int. Cl.[7] .............................................. G11C 11/15
(52) U.S. Cl. ........................ 365/173; 365/158; 365/171
(58) Field of Search ................................ 365/171, 173, 365/158, 177

(56) References Cited

U.S. PATENT DOCUMENTS

| | | | |
|---|---|---|---|
| 6,285,581 B1 * | 9/2001 | Tehrani et al. ............... | 365/173 |
| 6,430,085 B1 | 8/2002 | Rizzo .......................... | 365/173 |
| 6,556,473 B2 | 4/2003 | Saito et al. .................. | 365/158 |
| 6,639,830 B1 | 10/2003 | Heide .......................... | 365/158 |
| 2003/0123283 A1 * | 7/2003 | Amano et al. ............... | 365/173 |
| 2003/0156476 A1 * | 8/2003 | Kishi et al. .................. | 365/200 |
| 2004/0100818 A1 * | 5/2004 | Yoda et al. .................. | 365/173 |

OTHER PUBLICATIONS

J.S. Moodera, et al., J. Appl. Phys., vol. 79, No. 8, pp. 4724–4729, "Ferromagnetic–Insulator–Ferromagnetic Tunneling: Spin–Dependent Tunneling and Large Magnetoresistance in Trilayer Junctions (Invited)", Apr. 15, 1996.

F. Montaigne, et al., Applied Physics Letters, vol. 73, No. 19, pp. 2829–2831, "Enhanced Tunnel Magnetoresistance at High Bias Voltage in Double–Barrier Planar Junctions", Nov. 9, 1998.

L.F. Schelp, et al., Physical Review B, vol. 56, No. 10, pp. R–5747–R5750, "Spin–Dependent Tunneling With Coulomb Blockade", Sep. 1, 1997.

Y. Saito, et al., Jpn. J. Appl. Phys., vol. 39, No. 10B, pp. L–1035–L 1038, "Correlation Between Barrier Width, Barrier Height, and DC Bias Voltage Dependencies on the Magnetoresistance Ratio in Ir–Mn Exchange Biased Single and Double Tunnel Junctions", Oct. 15, 2000.

* cited by examiner

Primary Examiner—Richard Elms
Assistant Examiner—Hien Nguyen
(74) Attorney, Agent, or Firm—Oblon, Spivak, McClelland, Maier & Neustadt, P.C.

(57) ABSTRACT

A magnetic memory includes a magnetoresistance effect element having a magnetic recording layer, a first wiring extending in a first direction on or below the magnetoresistance effect element, a covering layer provided on at least both sides of the first wiring, and a writing circuit configured to pass a current through the first wiring in order to record information in the magnetic recording layer by a magnetic field generated by the current. The covering layer is made of magnetic material and has a uniaxial anisotropy in the first direction, along which a magnetization of the covering layer occurs.

20 Claims, 38 Drawing Sheets

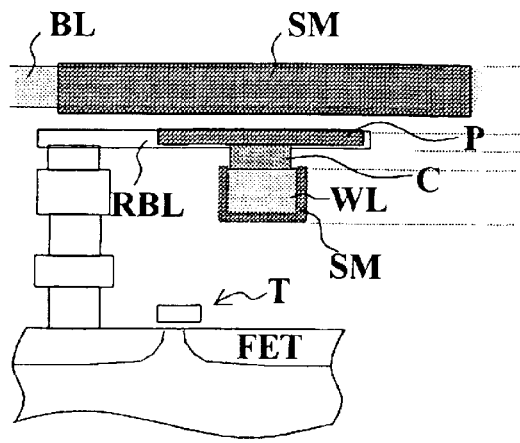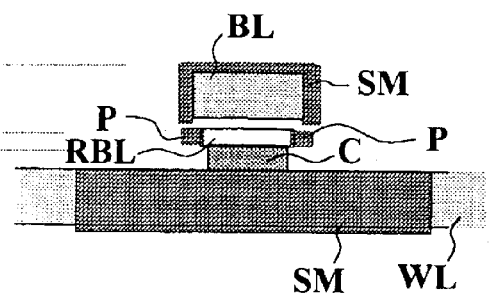
FIG.17A   FIG.17B
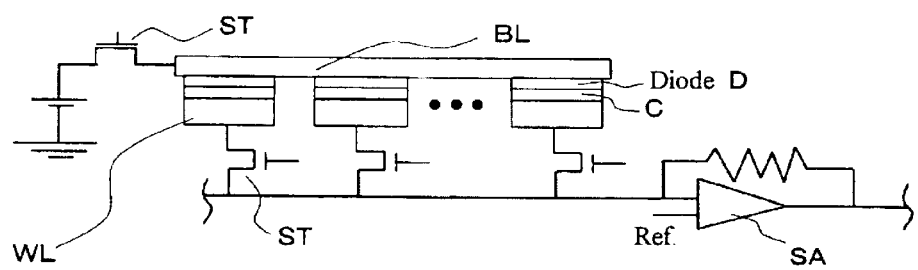
FIG.18
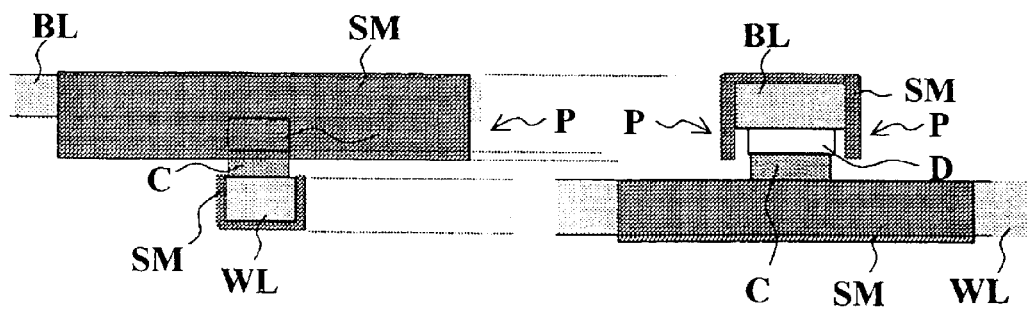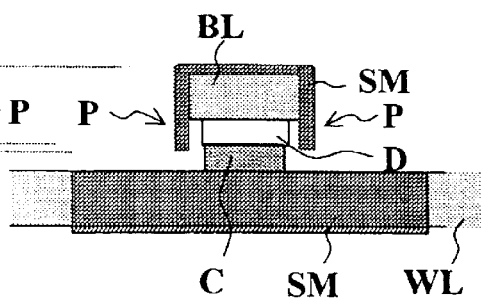
FIG.19A   FIG.19B

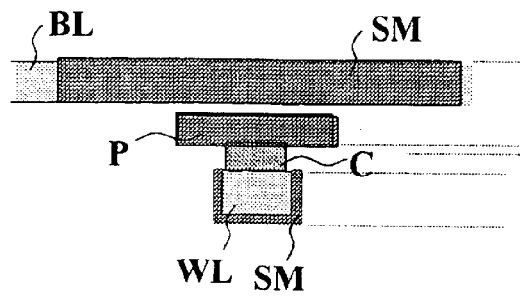
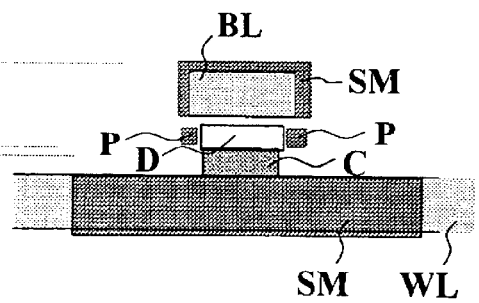
FIG.20A          FIG.20B
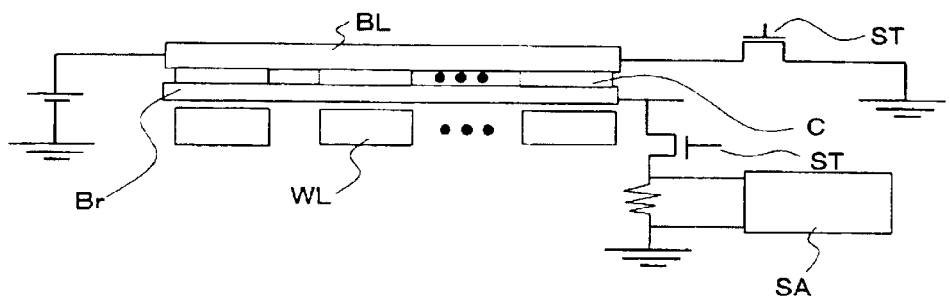
FIG.21
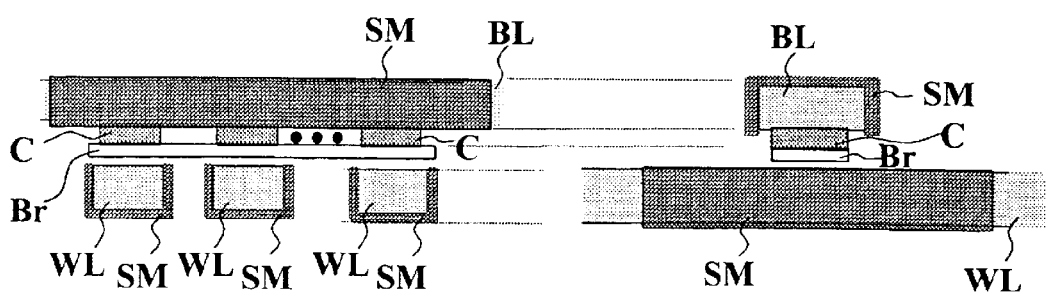
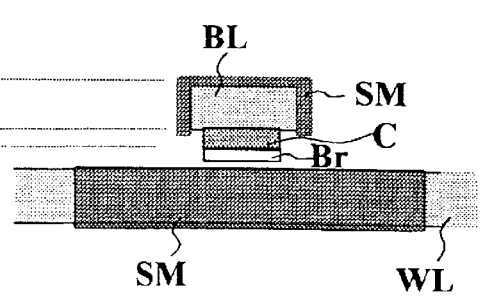
FIG.22A          FIG.22B

| Thickness t of SM (μm) | Longer axis of TMR (μm) | L3 (μm) | L1 (μm) | Defect of operation |
|---|---|---|---|---|
| 0.01 | 0.3 | 0.45 | 0.3 | YES |
| 0.02 | 0.3 | 0.45 | 0.3 | YES |
| 0.04 | 0.3 | 0.45 | 0.3 | YES |
| 0.06 | 0.3 | 0.45 | 0.3 | YES |
| 0.01 | 0.45 | 0.6 | 0.45 | YES |
| 0.02 | 0.45 | 0.6 | 0.45 | YES |
| 0.04 | 0.45 | 0.6 | 0.45 | YES |
| 0.06 | 0.45 | 0.6 | 0.45 | YES |
| 0.01 | 0.6 | 0.75 | 0.6 | YES |
| 0.02 | 0.6 | 0.75 | 0.6 | YES |
| 0.04 | 0.6 | 0.75 | 0.6 | YES |
| 0.06 | 0.6 | 0.75 | 0.6 | YES |
| 0.01 | 0.8 | 0.95 | 0.8 | YES |
| 0.02 | 0.8 | 0.95 | 0.8 | YES |
| 0.04 | 0.8 | 0.95 | 0.8 | YES |
| 0.06 | 0.8 | 0.95 | 0.8 | YES |
| 0.01 | 0.3 | 0.45 | 0.5 | YES |
| 0.02 | 0.3 | 0.45 | 0.5 | YES |
| 0.04 | 0.3 | 0.45 | 0.5 | YES |
| 0.06 | 0.3 | 0.45 | 0.5 | YES |
| 0.01 | 0.45 | 0.6 | 0.65 | YES |
| 0.02 | 0.45 | 0.6 | 0.65 | YES |
| 0.04 | 0.45 | 0.6 | 0.65 | YES |
| 0.06 | 0.45 | 0.6 | 0.65 | YES |
| 0.01 | 0.6 | 0.75 | 0.8 | YES |
| 0.02 | 0.6 | 0.75 | 0.8 | YES |
| 0.04 | 0.6 | 0.75 | 0.8 | YES |
| 0.06 | 0.6 | 0.75 | 0.8 | YES |
| 0.01 | 0.8 | 0.95 | 1 | YES |
| 0.02 | 0.8 | 0.95 | 1 | YES |
| 0.04 | 0.8 | 0.95 | 1 | YES |
| 0.06 | 0.8 | 0.95 | 1 | YES |

FIG.38

| Thickness t of SM (μm) | Longer axis of TMR (μm) | L3 (μm) | L1 (μm) | Defect of operation |
|---|---|---|---|---|
| 0.01 | 0.3 | 0.45 | 0.7 | YES |
| 0.02 | 0.3 | 0.45 | 0.7 | YES |
| 0.04 | 0.3 | 0.45 | 0.7 | YES |
| 0.06 | 0.3 | 0.45 | 0.7 | YES |
| 0.01 | 0.45 | 0.6 | 0.85 | YES |
| 0.02 | 0.45 | 0.6 | 0.85 | YES |
| 0.04 | 0.45 | 0.6 | 0.85 | YES |
| 0.06 | 0.45 | 0.6 | 0.85 | YES |
| 0.01 | 0.6 | 0.75 | 1 | YES |
| 0.02 | 0.6 | 0.75 | 1 | YES |
| 0.04 | 0.6 | 0.75 | 1 | YES |
| 0.06 | 0.6 | 0.75 | 1 | YES |
| 0.01 | 0.8 | 0.95 | 1.2 | YES |
| 0.02 | 0.8 | 0.95 | 1.2 | YES |
| 0.04 | 0.8 | 0.95 | 1.2 | YES |
| 0.06 | 0.8 | 0.95 | 1.2 | YES |
| 0.01 | 0.3 | 0.45 | 0.9 | YES |
| 0.02 | 0.3 | 0.45 | 0.9 | YES |
| 0.04 | 0.3 | 0.45 | 0.9 | YES |
| 0.06 | 0.3 | 0.45 | 0.9 | YES |
| 0.01 | 0.45 | 0.6 | 1.05 | NO |
| 0.02 | 0.45 | 0.6 | 1.05 | NO |
| 0.04 | 0.45 | 0.6 | 1.05 | NO |
| 0.06 | 0.45 | 0.6 | 1.05 | YES |
| 0.01 | 0.6 | 0.75 | 1.2 | YES |
| 0.02 | 0.6 | 0.75 | 1.2 | YES |
| 0.04 | 0.6 | 0.75 | 1.2 | YES |
| 0.06 | 0.6 | 0.75 | 1.2 | YES |
| 0.01 | 0.8 | 0.95 | 1.4 | YES |
| 0.02 | 0.8 | 0.95 | 1.4 | YES |
| 0.04 | 0.8 | 0.95 | 1.4 | YES |
| 0.06 | 0.8 | 0.95 | 1.4 | YES |

FIG.39

| Thickness t of SM (μm) | Longer axis of TMR (μm) | L3 (μm) | L1 (μm) | Defect of operation |
|---|---|---|---|---|
| 0.01 | 0.3 | 0.45 | 1.1 | NO |
| 0.02 | 0.3 | 0.45 | 1.1 | NO |
| 0.04 | 0.3 | 0.45 | 1.1 | NO |
| 0.06 | 0.3 | 0.45 | 1.1 | YES |
| 0.01 | 0.45 | 0.6 | 1.25 | NO |
| 0.02 | 0.45 | 0.6 | 1.25 | NO |
| 0.04 | 0.45 | 0.6 | 1.25 | NO |
| 0.06 | 0.45 | 0.6 | 1.25 | YES |
| 0.01 | 0.6 | 0.75 | 1.4 | NO |
| 0.02 | 0.6 | 0.75 | 1.4 | YES |
| 0.04 | 0.6 | 0.75 | 1.4 | YES |
| 0.06 | 0.6 | 0.75 | 1.4 | YES |
| 0.01 | 0.8 | 0.95 | 1.6 | YES |
| 0.02 | 0.8 | 0.95 | 1.6 | YES |
| 0.04 | 0.8 | 0.95 | 1.6 | YES |
| 0.06 | 0.8 | 0.95 | 1.6 | YES |
| 0.01 | 0.3 | 0.45 | 1.45 | NO |
| 0.02 | 0.3 | 0.45 | 1.45 | NO |
| 0.04 | 0.3 | 0.45 | 1.45 | NO |
| 0.06 | 0.3 | 0.45 | 1.45 | YES |
| 0.01 | 0.45 | 0.6 | 1.6 | NO |
| 0.02 | 0.45 | 0.6 | 1.6 | NO |
| 0.04 | 0.45 | 0.6 | 1.6 | NO |
| 0.06 | 0.45 | 0.6 | 1.6 | YES |
| 0.01 | 0.6 | 0.75 | 1.8 | YES |
| 0.02 | 0.6 | 0.75 | 1.8 | YES |
| 0.04 | 0.6 | 0.75 | 1.8 | NO |
| 0.06 | 0.6 | 0.75 | 1.8 | YES |
| 0.01 | 0.8 | 0.95 | 1.5 | YES |
| 0.02 | 0.8 | 0.95 | 1.5 | YES |
| 0.04 | 0.8 | 0.95 | 1.5 | YES |
| 0.06 | 0.8 | 0.95 | 1.5 | YES |

FIG. 40

| Thickness t of SM ($\mu$m) | Longer axis of TMR ($\mu$m) | L3 ($\mu$m) | L1 ($\mu$m) | Defect of operation |
|---|---|---|---|---|
| 0.01 | 0.3 | 0.45 | 1.7 | NO |
| 0.02 | 0.3 | 0.45 | 1.7 | NO |
| 0.04 | 0.3 | 0.45 | 1.7 | NO |
| 0.06 | 0.3 | 0.45 | 1.7 | YES |
| 0.01 | 0.45 | 0.6 | 1.85 | NO |
| 0.02 | 0.45 | 0.6 | 1.85 | NO |
| 0.04 | 0.45 | 0.6 | 1.85 | NO |
| 0.06 | 0.45 | 0.6 | 1.85 | YES |
| 0.01 | 0.6 | 0.75 | 2 | YES |
| 0.02 | 0.6 | 0.75 | 2 | YES |
| 0.04 | 0.6 | 0.75 | 2 | YES |
| 0.06 | 0.6 | 0.75 | 2 | YES |
| 0.01 | 0.3 | 0.45 | 2 | NO |
| 0.02 | 0.3 | 0.45 | 2 | NO |
| 0.04 | 0.3 | 0.45 | 2 | NO |
| 0.06 | 0.3 | 0.45 | 2 | YES |
| 0.01 | 0.45 | 0.6 | 2 | NO |
| 0.02 | 0.45 | 0.6 | 2 | NO |
| 0.04 | 0.45 | 0.6 | 2 | NO |
| 0.06 | 0.45 | 0.6 | 2 | YES |

FIG.41

| Thickness t of SM (μm) | Longer axis of TMR (μm) | L3 (μm) | L1 (μm) | Defect of operation |
| --- | --- | --- | --- | --- |
| 0.01 | 0.3 | 0.45 | 0.3 | YES |
| 0.02 | 0.3 | 0.45 | 0.3 | NO |
| 0.04 | 0.3 | 0.45 | 0.3 | NO |
| 0.06 | 0.3 | 0.45 | 0.3 | NO |
| 0.01 | 0.45 | 0.6 | 0.45 | YES |
| 0.02 | 0.45 | 0.6 | 0.45 | NO |
| 0.04 | 0.45 | 0.6 | 0.45 | NO |
| 0.06 | 0.45 | 0.6 | 0.45 | NO |
| 0.01 | 0.6 | 0.75 | 0.6 | YES |
| 0.02 | 0.6 | 0.75 | 0.6 | NO |
| 0.04 | 0.6 | 0.75 | 0.6 | NO |
| 0.06 | 0.6 | 0.75 | 0.6 | NO |
| 0.01 | 0.8 | 0.95 | 0.8 | NO |
| 0.02 | 0.8 | 0.95 | 0.8 | NO |
| 0.04 | 0.8 | 0.95 | 0.8 | NO |
| 0.06 | 0.8 | 0.95 | 0.8 | YES |
| 0.01 | 0.3 | 0.45 | 0.5 | NO |
| 0.02 | 0.3 | 0.45 | 0.5 | NO |
| 0.04 | 0.3 | 0.45 | 0.5 | NO |
| 0.06 | 0.3 | 0.45 | 0.5 | YES |

FIG.42

| Thickness t of SM (μm) | Longer axis of TMR (μm) | L3 (μm) | L1 (μm) | Defect of operation |
|---|---|---|---|---|
| 0.01 | 0.3 | 0.45 | 0.7 | YES |
| 0.02 | 0.3 | 0.45 | 0.7 | NO |
| 0.04 | 0.3 | 0.45 | 0.7 | NO |
| 0.06 | 0.3 | 0.45 | 0.7 | NO |
| 0.01 | 0.45 | 0.6 | 0.85 | NO |
| 0.02 | 0.45 | 0.6 | 0.85 | NO |
| 0.04 | 0.45 | 0.6 | 0.85 | NO |
| 0.06 | 0.45 | 0.6 | 0.85 | YES |
| 0.01 | 0.6 | 0.75 | 1 | NO |
| 0.02 | 0.6 | 0.75 | 1 | NO |
| 0.04 | 0.6 | 0.75 | 1 | NO |
| 0.06 | 0.6 | 0.75 | 1 | YES |
| 0.01 | 0.8 | 0.95 | 1.2 | NO |
| 0.02 | 0.8 | 0.95 | 1.2 | NO |
| 0.04 | 0.8 | 0.95 | 1.2 | NO |
| 0.06 | 0.8 | 0.95 | 1.2 | NO |
| 0.01 | 0.3 | 0.45 | 0.9 | NO |
| 0.02 | 0.3 | 0.45 | 0.9 | NO |
| 0.04 | 0.3 | 0.45 | 0.9 | NO |
| 0.06 | 0.3 | 0.45 | 0.9 | YES |

FIG.43

| Thickness t of SM (μm) | Longer axis of TMR (μm) | L3 (μm) | L1 (μm) | Defect of operation |
|---|---|---|---|---|
| 0.01 | 0.3 | 0.45 | 1.1 | NO |
| 0.02 | 0.3 | 0.45 | 1.1 | NO |
| 0.04 | 0.3 | 0.45 | 1.1 | NO |
| 0.06 | 0.3 | 0.45 | 1.1 | YES |
| 0.01 | 0.45 | 0.6 | 1.25 | NO |
| 0.02 | 0.45 | 0.6 | 1.25 | NO |
| 0.04 | 0.45 | 0.6 | 1.25 | NO |
| 0.06 | 0.45 | 0.6 | 1.25 | NO |
| 0.01 | 0.6 | 0.75 | 1.4 | NO |
| 0.02 | 0.6 | 0.75 | 1.4 | NO |
| 0.04 | 0.6 | 0.75 | 1.4 | YES |
| 0.06 | 0.6 | 0.75 | 1.4 | NO |
| 0.01 | 0.8 | 0.95 | 1.6 | YES |
| 0.02 | 0.8 | 0.95 | 1.6 | NO |
| 0.04 | 0.8 | 0.95 | 1.6 | NO |
| 0.06 | 0.8 | 0.95 | 1.6 | NO |
| 0.01 | 0.3 | 0.45 | 1.45 | NO |
| 0.02 | 0.3 | 0.45 | 1.45 | NO |
| 0.04 | 0.3 | 0.45 | 1.45 | NO |
| 0.06 | 0.3 | 0.45 | 1.45 | YES |

FIG.44

| Thickness t of SM ($\mu$m) | Longer axis of TMR ($\mu$m) | L3 ($\mu$m) | L1 ($\mu$m) | Defect of operation |
|---|---|---|---|---|
| 0.01 | 0.3 | 0.45 | 1.1 | YES |
| 0.02 | 0.3 | 0.45 | 1.1 | YES |
| 0.04 | 0.3 | 0.45 | 1.1 | YES |
| 0.06 | 0.3 | 0.45 | 1.1 | YES |
| 0.01 | 0.45 | 0.6 | 1.25 | YES |
| 0.02 | 0.45 | 0.6 | 1.25 | YES |
| 0.04 | 0.45 | 0.6 | 1.25 | YES |
| 0.06 | 0.45 | 0.6 | 1.25 | YES |
| 0.01 | 0.6 | 0.75 | 1.4 | YES |
| 0.02 | 0.6 | 0.75 | 1.4 | YES |
| 0.04 | 0.6 | 0.75 | 1.4 | YES |
| 0.06 | 0.6 | 0.75 | 1.4 | YES |
| 0.01 | 0.8 | 0.95 | 1.6 | YES |
| 0.02 | 0.8 | 0.95 | 1.6 | YES |
| 0.04 | 0.8 | 0.95 | 1.6 | YES |
| 0.06 | 0.8 | 0.95 | 1.6 | YES |
| 0.01 | 0.3 | 0.45 | 1.45 | NO |
| 0.02 | 0.3 | 0.45 | 1.45 | YES |
| 0.04 | 0.3 | 0.45 | 1.45 | YES |
| 0.06 | 0.3 | 0.45 | 1.45 | YES |
| 0.01 | 0.45 | 0.6 | 1.6 | NO |
| 0.02 | 0.45 | 0.6 | 1.6 | NO |
| 0.04 | 0.45 | 0.6 | 1.6 | YES |
| 0.06 | 0.45 | 0.6 | 1.6 | YES |
| 0.01 | 0.6 | 0.75 | 1.8 | YES |
| 0.02 | 0.6 | 0.75 | 1.8 | YES |
| 0.04 | 0.6 | 0.75 | 1.8 | YES |
| 0.06 | 0.6 | 0.75 | 1.8 | YES |
| 0.01 | 0.8 | 0.95 | 1.5 | YES |
| 0.02 | 0.8 | 0.95 | 1.5 | YES |
| 0.04 | 0.8 | 0.95 | 1.5 | YES |
| 0.06 | 0.8 | 0.95 | 1.5 | YES |

FIG.45

| Thickness t of SM ($\mu$m) | Longer axis of TMR ($\mu$m) | L3 ($\mu$m) | L1 ($\mu$m) | Defect of operation |
|---|---|---|---|---|
| 0.01 | 0.3 | 0.45 | 1.7 | YES |
| 0.02 | 0.3 | 0.45 | 1.7 | YES |
| 0.04 | 0.3 | 0.45 | 1.7 | YES |
| 0.06 | 0.3 | 0.45 | 1.7 | YES |
| 0.01 | 0.45 | 0.6 | 1.85 | NO |
| 0.02 | 0.45 | 0.6 | 1.85 | NO |
| 0.04 | 0.45 | 0.6 | 1.85 | YES |
| 0.06 | 0.45 | 0.6 | 1.85 | YES |
| 0.01 | 0.6 | 0.75 | 2 | NO |
| 0.02 | 0.6 | 0.75 | 2 | YES |
| 0.04 | 0.6 | 0.75 | 2 | YES |
| 0.06 | 0.6 | 0.75 | 2 | YES |
| 0.01 | 0.3 | 0.45 | 2 | NO |
| 0.02 | 0.3 | 0.45 | 2 | NO |
| 0.04 | 0.3 | 0.45 | 2 | YES |
| 0.06 | 0.3 | 0.45 | 2 | YES |
| 0.01 | 0.45 | 0.6 | 2 | NO |
| 0.02 | 0.45 | 0.6 | 2 | NO |
| 0.04 | 0.45 | 0.6 | 2 | YES |
| 0.06 | 0.45 | 0.6 | 2 | YES |

FIG.46

| Thickness t of SM (μm) | Longer axis of TMR (μm) | L3 (μm) | L1 (μm) | Defect of operation |
|---|---|---|---|---|
| 0.01 | 0.3 | 0.45 | 0.3 | YES |
| 0.02 | 0.3 | 0.45 | 0.3 | YES |
| 0.04 | 0.3 | 0.45 | 0.3 | YES |
| 0.06 | 0.3 | 0.45 | 0.3 | YES |
| 0.01 | 0.45 | 0.6 | 0.45 | YES |
| 0.02 | 0.45 | 0.6 | 0.45 | YES |
| 0.04 | 0.45 | 0.6 | 0.45 | YES |
| 0.06 | 0.45 | 0.6 | 0.45 | YES |
| 0.01 | 0.6 | 0.75 | 0.6 | YES |
| 0.02 | 0.6 | 0.75 | 0.6 | YES |
| 0.04 | 0.6 | 0.75 | 0.6 | YES |
| 0.06 | 0.6 | 0.75 | 0.6 | YES |
| 0.01 | 0.8 | 0.95 | 0.8 | YES |
| 0.02 | 0.8 | 0.95 | 0.8 | YES |
| 0.04 | 0.8 | 0.95 | 0.8 | YES |
| 0.06 | 0.8 | 0.95 | 0.8 | YES |
| 0.01 | 0.3 | 0.45 | 0.5 | YES |
| 0.02 | 0.3 | 0.45 | 0.5 | YES |
| 0.04 | 0.3 | 0.45 | 0.5 | YES |
| 0.06 | 0.3 | 0.45 | 0.5 | YES |
| 0.01 | 0.45 | 0.6 | 0.65 | YES |
| 0.02 | 0.45 | 0.6 | 0.65 | YES |
| 0.04 | 0.45 | 0.6 | 0.65 | YES |
| 0.06 | 0.45 | 0.6 | 0.65 | YES |
| 0.01 | 0.6 | 0.75 | 0.8 | YES |
| 0.02 | 0.6 | 0.75 | 0.8 | YES |
| 0.04 | 0.6 | 0.75 | 0.8 | YES |
| 0.06 | 0.6 | 0.75 | 0.8 | YES |
| 0.01 | 0.8 | 0.95 | 1 | YES |
| 0.02 | 0.8 | 0.95 | 1 | YES |
| 0.04 | 0.8 | 0.95 | 1 | YES |
| 0.06 | 0.8 | 0.95 | 1 | YES |

FIG. 47

| Thickness t of SM (μm) | Longer axis of TMR (μm) | L3 (μm) | L1 (μm) | Defect of operation |
|---|---|---|---|---|
| 0.01 | 0.3 | 0.45 | 0.7 | YES |
| 0.02 | 0.3 | 0.45 | 0.7 | YES |
| 0.04 | 0.3 | 0.45 | 0.7 | YES |
| 0.06 | 0.3 | 0.45 | 0.7 | YES |
| 0.01 | 0.45 | 0.6 | 0.85 | YES |
| 0.02 | 0.45 | 0.6 | 0.85 | YES |
| 0.04 | 0.45 | 0.6 | 0.85 | YES |
| 0.06 | 0.45 | 0.6 | 0.85 | YES |
| 0.01 | 0.6 | 0.75 | 1 | YES |
| 0.02 | 0.6 | 0.75 | 1 | YES |
| 0.04 | 0.6 | 0.75 | 1 | YES |
| 0.06 | 0.6 | 0.75 | 1 | YES |
| 0.01 | 0.8 | 0.95 | 1.2 | YES |
| 0.02 | 0.8 | 0.95 | 1.2 | YES |
| 0.04 | 0.8 | 0.95 | 1.2 | YES |
| 0.06 | 0.8 | 0.95 | 1.2 | YES |
| 0.01 | 0.3 | 0.45 | 0.9 | YES |
| 0.02 | 0.3 | 0.45 | 0.9 | YES |
| 0.04 | 0.3 | 0.45 | 0.9 | YES |
| 0.06 | 0.3 | 0.45 | 0.9 | YES |
| 0.01 | 0.45 | 0.6 | 1.05 | NO |
| 0.02 | 0.45 | 0.6 | 1.05 | NO |
| 0.04 | 0.45 | 0.6 | 1.05 | NO |
| 0.06 | 0.45 | 0.6 | 1.05 | YES |
| 0.01 | 0.6 | 0.75 | 1.2 | YES |
| 0.02 | 0.6 | 0.75 | 1.2 | YES |
| 0.04 | 0.6 | 0.75 | 1.2 | YES |
| 0.06 | 0.6 | 0.75 | 1.2 | YES |
| 0.01 | 0.8 | 0.95 | 1.4 | YES |
| 0.02 | 0.8 | 0.95 | 1.4 | YES |
| 0.04 | 0.8 | 0.95 | 1.4 | YES |
| 0.06 | 0.8 | 0.95 | 1.4 | YES |

FIG.48

| Thickness t of SM (μm) | Longer axis of TMR (μm) | L3 (μm) | L1 (μm) | Defect of operation |
|---|---|---|---|---|
| 0.01 | 0.3 | 0.45 | 1.1 | NO |
| 0.02 | 0.3 | 0.45 | 1.1 | NO |
| 0.04 | 0.3 | 0.45 | 1.1 | NO |
| 0.06 | 0.3 | 0.45 | 1.1 | YES |
| 0.01 | 0.45 | 0.6 | 1.25 | NO |
| 0.02 | 0.45 | 0.6 | 1.25 | NO |
| 0.04 | 0.45 | 0.6 | 1.25 | NO |
| 0.06 | 0.45 | 0.6 | 1.25 | YES |
| 0.01 | 0.6 | 0.75 | 1.4 | YES |
| 0.02 | 0.6 | 0.75 | 1.4 | YES |
| 0.04 | 0.6 | 0.75 | 1.4 | YES |
| 0.06 | 0.6 | 0.75 | 1.4 | YES |
| 0.01 | 0.8 | 0.95 | 1.6 | YES |
| 0.02 | 0.8 | 0.95 | 1.6 | YES |
| 0.04 | 0.8 | 0.95 | 1.6 | YES |
| 0.06 | 0.8 | 0.95 | 1.6 | YES |
| 0.01 | 0.3 | 0.45 | 1.45 | NO |
| 0.02 | 0.3 | 0.45 | 1.45 | NO |
| 0.04 | 0.3 | 0.45 | 1.45 | NO |
| 0.06 | 0.3 | 0.45 | 1.45 | YES |
| 0.01 | 0.45 | 0.6 | 1.6 | NO |
| 0.02 | 0.45 | 0.6 | 1.6 | NO |
| 0.04 | 0.45 | 0.6 | 1.6 | NO |
| 0.06 | 0.45 | 0.6 | 1.6 | YES |
| 0.01 | 0.6 | 0.75 | 1.8 | YES |
| 0.02 | 0.6 | 0.75 | 1.8 | YES |
| 0.04 | 0.6 | 0.75 | 1.8 | YES |
| 0.06 | 0.6 | 0.75 | 1.8 | YES |
| 0.01 | 0.8 | 0.95 | 1.5 | YES |
| 0.02 | 0.8 | 0.95 | 1.5 | YES |
| 0.04 | 0.8 | 0.95 | 1.5 | YES |
| 0.06 | 0.8 | 0.95 | 1.5 | YES |

FIG.49

| Thickness t of SM (μm) | Longer axis of TMR (μm) | L3 (μm) | L1 (μm) | Defect of operation |
|---|---|---|---|---|
| 0.01 | 0.3 | 0.45 | 1.7 | NO |
| 0.02 | 0.3 | 0.45 | 1.7 | NO |
| 0.04 | 0.3 | 0.45 | 1.7 | NO |
| 0.06 | 0.3 | 0.45 | 1.7 | YES |
| 0.01 | 0.45 | 0.6 | 1.85 | NO |
| 0.02 | 0.45 | 0.6 | 1.85 | NO |
| 0.04 | 0.45 | 0.6 | 1.85 | NO |
| 0.06 | 0.45 | 0.6 | 1.85 | YES |
| 0.01 | 0.6 | 0.75 | 2 | YES |
| 0.02 | 0.6 | 0.75 | 2 | YES |
| 0.04 | 0.6 | 0.75 | 2 | YES |
| 0.06 | 0.6 | 0.75 | 2 | YES |
| 0.01 | 0.3 | 0.45 | 2 | NO |
| 0.02 | 0.3 | 0.45 | 2 | NO |
| 0.04 | 0.3 | 0.45 | 2 | NO |
| 0.06 | 0.3 | 0.45 | 2 | YES |
| 0.01 | 0.45 | 0.6 | 2 | NO |
| 0.02 | 0.45 | 0.6 | 2 | NO |
| 0.04 | 0.45 | 0.6 | 2 | NO |
| 0.06 | 0.45 | 0.6 | 2 | YES |

FIG. 50

| Thickness t of SM ($\mu$m) | Longer axis of TMR ($\mu$m) | L3 ($\mu$m) | L1 ($\mu$m) | Defect of operation |
|---|---|---|---|---|
| 0.01 | 0.3 | 0.45 | 1.1 | YES |
| 0.02 | 0.3 | 0.45 | 1.1 | YES |
| 0.04 | 0.3 | 0.45 | 1.1 | YES |
| 0.06 | 0.3 | 0.45 | 1.1 | YES |
| 0.01 | 0.45 | 0.6 | 1.25 | YES |
| 0.02 | 0.45 | 0.6 | 1.25 | YES |
| 0.04 | 0.45 | 0.6 | 1.25 | YES |
| 0.06 | 0.45 | 0.6 | 1.25 | YES |
| 0.01 | 0.6 | 0.75 | 1.4 | YES |
| 0.02 | 0.6 | 0.75 | 1.4 | YES |
| 0.04 | 0.6 | 0.75 | 1.4 | YES |
| 0.06 | 0.6 | 0.75 | 1.4 | YES |
| 0.01 | 0.8 | 0.95 | 1.6 | YES |
| 0.02 | 0.8 | 0.95 | 1.6 | YES |
| 0.04 | 0.8 | 0.95 | 1.6 | YES |
| 0.06 | 0.8 | 0.95 | 1.6 | YES |
| 0.01 | 0.3 | 0.45 | 1.45 | NO |
| 0.02 | 0.3 | 0.45 | 1.45 | YES |
| 0.04 | 0.3 | 0.45 | 1.45 | YES |
| 0.06 | 0.3 | 0.45 | 1.45 | YES |
| 0.01 | 0.45 | 0.6 | 1.6 | NO |
| 0.02 | 0.45 | 0.6 | 1.6 | NO |
| 0.04 | 0.45 | 0.6 | 1.6 | YES |
| 0.06 | 0.45 | 0.6 | 1.6 | YES |
| 0.01 | 0.6 | 0.75 | 1.8 | YES |
| 0.02 | 0.6 | 0.75 | 1.8 | YES |
| 0.04 | 0.6 | 0.75 | 1.8 | YES |
| 0.06 | 0.6 | 0.75 | 1.8 | YES |
| 0.01 | 0.8 | 0.95 | 1.5 | YES |
| 0.02 | 0.8 | 0.95 | 1.5 | YES |
| 0.04 | 0.8 | 0.95 | 1.5 | YES |
| 0.06 | 0.8 | 0.95 | 1.5 | YES |

FIG.51

| Thickness t of SM (μm) | Longer axis of TMR (μm) | L3 (μm) | L1 (μm) | Defect of operation |
|---|---|---|---|---|
| 0.01 | 0.3 | 0.45 | 1.7 | YES |
| 0.02 | 0.3 | 0.45 | 1.7 | YES |
| 0.04 | 0.3 | 0.45 | 1.7 | YES |
| 0.06 | 0.3 | 0.45 | 1.7 | YES |
| 0.01 | 0.45 | 0.6 | 1.85 | NO |
| 0.02 | 0.45 | 0.6 | 1.85 | NO |
| 0.04 | 0.45 | 0.6 | 1.85 | YES |
| 0.06 | 0.45 | 0.6 | 1.85 | YES |
| 0.01 | 0.6 | 0.75 | 2 | NO |
| 0.02 | 0.6 | 0.75 | 2 | YES |
| 0.04 | 0.6 | 0.75 | 2 | YES |
| 0.06 | 0.6 | 0.75 | 2 | YES |
| 0.01 | 0.3 | 0.45 | 2 | NO |
| 0.02 | 0.3 | 0.45 | 2 | NO |
| 0.04 | 0.3 | 0.45 | 2 | YES |
| 0.06 | 0.3 | 0.45 | 2 | YES |
| 0.01 | 0.45 | 0.6 | 2 | NO |
| 0.02 | 0.45 | 0.6 | 2 | NO |
| 0.04 | 0.45 | 0.6 | 2 | YES |
| 0.06 | 0.45 | 0.6 | 2 | YES |

FIG.52

| Thickness t of SM (μm) | Longer axis of TMR (μm) | L3 (μm) | L1 (μm) | Defect of operation |
| --- | --- | --- | --- | --- |
| 0.01 | 0.3 | 0.45 | 0.3 | YES |
| 0.02 | 0.3 | 0.45 | 0.3 | YES |
| 0.04 | 0.3 | 0.45 | 0.3 | YES |
| 0.06 | 0.3 | 0.45 | 0.3 | NO |
| 0.01 | 0.45 | 0.6 | 0.45 | YES |
| 0.02 | 0.45 | 0.6 | 0.45 | NO |
| 0.04 | 0.45 | 0.6 | 0.45 | NO |
| 0.06 | 0.45 | 0.6 | 0.45 | YES |
| 0.01 | 0.6 | 0.75 | 0.6 | NO |
| 0.02 | 0.6 | 0.75 | 0.6 | NO |
| 0.04 | 0.6 | 0.75 | 0.6 | NO |
| 0.06 | 0.6 | 0.75 | 0.6 | YES |
| 0.01 | 0.8 | 0.95 | 0.8 | NO |
| 0.02 | 0.8 | 0.95 | 0.8 | NO |
| 0.04 | 0.8 | 0.95 | 0.8 | NO |
| 0.06 | 0.8 | 0.95 | 0.8 | YES |
| 0.01 | 0.3 | 0.45 | 0.5 | NO |
| 0.02 | 0.3 | 0.45 | 0.5 | NO |
| 0.04 | 0.3 | 0.45 | 0.5 | NO |
| 0.06 | 0.3 | 0.45 | 0.5 | YES |
| 0.01 | 0.45 | 0.6 | 0.65 | YES |
| 0.02 | 0.45 | 0.6 | 0.65 | NO |
| 0.04 | 0.45 | 0.6 | 0.65 | NO |
| 0.06 | 0.45 | 0.6 | 0.65 | NO |

FIG.53

| Thickness t of SM (μm) | Longer axis of TMR (μm) | L3 (μm) | L1 (μm) | Defect of operation |
|---|---|---|---|---|
| 0.01 | 0.3 | 0.45 | 0.7 | YES |
| 0.02 | 0.3 | 0.45 | 0.7 | NO |
| 0.04 | 0.3 | 0.45 | 0.7 | YES |
| 0.06 | 0.3 | 0.45 | 0.7 | YES |
| 0.01 | 0.45 | 0.6 | 0.85 | NO |
| 0.02 | 0.45 | 0.6 | 0.85 | NO |
| 0.04 | 0.45 | 0.6 | 0.85 | NO |
| 0.06 | 0.45 | 0.6 | 0.85 | YES |
| 0.01 | 0.6 | 0.75 | 1 | NO |
| 0.02 | 0.6 | 0.75 | 1 | YES |
| 0.04 | 0.6 | 0.75 | 1 | NO |
| 0.06 | 0.6 | 0.75 | 1 | YES |
| 0.01 | 0.8 | 0.95 | 1.2 | NO |
| 0.02 | 0.8 | 0.95 | 1.2 | NO |
| 0.04 | 0.8 | 0.95 | 1.2 | NO |
| 0.06 | 0.8 | 0.95 | 1.2 | YES |
| 0.01 | 0.3 | 0.45 | 0.9 | NO |
| 0.02 | 0.3 | 0.45 | 0.9 | NO |
| 0.04 | 0.3 | 0.45 | 0.9 | NO |
| 0.06 | 0.3 | 0.45 | 0.9 | NO |
| 0.01 | 0.45 | 0.6 | 1.05 | NO |
| 0.02 | 0.45 | 0.6 | 1.05 | NO |
| 0.04 | 0.45 | 0.6 | 1.05 | NO |
| 0.06 | 0.45 | 0.6 | 1.05 | NO |

FIG.54

| Thickness t of SM (μm) | Longer axis of TMR (μm) | L3 (μm) | L1 (μm) | Defect of operation |
|---|---|---|---|---|
| 0.01 | 0.3 | 0.45 | 1.1 | NO |
| 0.02 | 0.3 | 0.45 | 1.1 | NO |
| 0.04 | 0.3 | 0.45 | 1.1 | NO |
| 0.06 | 0.3 | 0.45 | 1.1 | YES |
| 0.01 | 0.45 | 0.6 | 1.25 | NO |
| 0.02 | 0.45 | 0.6 | 1.25 | NO |
| 0.04 | 0.45 | 0.6 | 1.25 | NO |
| 0.06 | 0.45 | 0.6 | 1.25 | YES |
| 0.01 | 0.6 | 0.75 | 1.4 | NO |
| 0.02 | 0.6 | 0.75 | 1.4 | NO |
| 0.04 | 0.6 | 0.75 | 1.4 | NO |
| 0.06 | 0.6 | 0.75 | 1.4 | NO |
| 0.01 | 0.8 | 0.95 | 1.6 | NO |
| 0.02 | 0.8 | 0.95 | 1.6 | NO |
| 0.04 | 0.8 | 0.95 | 1.6 | NO |
| 0.06 | 0.8 | 0.95 | 1.6 | NO |
| 0.01 | 0.3 | 0.45 | 1.45 | NO |
| 0.02 | 0.3 | 0.45 | 1.45 | NO |
| 0.04 | 0.3 | 0.45 | 1.45 | NO |
| 0.06 | 0.3 | 0.45 | 1.45 | NO |
| 0.01 | 0.45 | 0.6 | 1.6 | NO |
| 0.02 | 0.45 | 0.6 | 1.6 | NO |
| 0.04 | 0.45 | 0.6 | 1.6 | NO |
| 0.06 | 0.45 | 0.6 | 1.6 | NO |

FIG.55

MAGNETIC MEMORY

CROSS-REFERENCE TO RELATED APPLICATIONS

This application is a continuation application of Ser. No. 10/345,253, filed Jan. 16, 2003 now U.S. Pat. No. 6,717,845, and claims the benefit of priority from prior Japanese Patent Application No. 2002-007877, filed on Jan. 16, 2002, the entire contents of which are incorporated herein by reference.

BACKGROUND OF THE INVENTION

1. Field of the Invention

This invention relates to a magnetic memory, and more particularly, to a large-capacity high-speed magnetic memory having the integrated memory cells including magnetoresistance effect elements of a ferromagnetic tunneling type, for example, and reduced in cross talk between the memory cells while making a stable read-out and write-in with a reduced power consumption.

2. Discussion of the Background

Magnetoresistance effect elements using magnetic films are currently used in magnetic heads, magnetic sensors, etc., and there is a proposal to use magnetoresistance effect elements in a solid-state magnetic memory (magnetoresistance memory or MRAM (magnetic random access memory)).

Recently, a so-called "tunneling magnetoresistance effect element (TMR element) has been proposed as a magnetoresistance effect element configured to flow a current perpendicularly to the film plane in a sandwich-structured film interposing a single dielectric layer between two magnetic metal layers and to use the tunneling current. Since tunneling magnetoresistance effect elements have been improved to ensure 20% or higher ratio of change in magnetoresistance (J. Appl. Phys. 79, 4724 (1996)), the possibility of civilian applications of MRAM is increasing.

A tunneling magnetoresistance effect element can be obtained by first forming a thin Al (aluminum) layer, 0.6 nm through 2.0 nm thick, on a ferromagnetic electrode, and thereafter exposing its surface to a glow discharge of oxygen or oxygen gas to form a tunnel barrier layer of $Al_2O_3$.

There is also proposed a ferromagnetic single tunneling junction structure in which an anti-ferromagnetic layer is provided in one of the ferromagnetic layers on one side of the single ferromagnetic tunneling junction and the other ferromagnetic layer is used as a magnetically pinned layer (Japanese Patent Laid-Open Publication No. H10-4227).

Other type ferromagnetic tunneling junction structures, namely, one having a ferromagnetic tunneling junction via magnetic particles distributed in a dielectric material and one having double ferromagnetic tunneling junctions (continuous film) have been proposed as well (Phys. Rev. B56(10), R5747 (1997), J. The Magnetics Society of Japan 23, 4–2, (1999), Appl. Phys. Lett. 73(19), 2829 (1998), Jpn. J. Appl. Phys. 39, L1035(2001)).

Also these ferromagnetic tunneling junctions have been improved to ensure a ratio of magnetoresistance change from 20 to 50% and to prevent a decrease of the ratio of magnetoresistance change even upon an increase of the voltage value applied to tunneling magnetoresistance effect elements to obtain a desired output voltage, and there is the possibility of their applications to MRAM.

Magnetic recording elements using such a single ferromagnetic tunneling junction or double ferromagnetic tunneling junctions are nonvolatile and have high potentials such as high write and read speed not slower than 10 nanoseconds and programmable frequency not less than $10^{15}$ times. Especially, ferromagnetic double-tunneling structures ensure large output voltages and exhibit favorable properties as magnetic recording elements because the ratio of magnetoresistance change does not decrease even upon an increase of the voltage value applied to tunneling magnetoresistance effect elements to obtain a desired output voltage value as mentioned above.

With regard to the memory cell size, however, those existing techniques involve the problem that the size cannot be decreased below semiconductor DRAM (dynamic random access memory) when a 1 Tr (transistor)—1 TMR architecture (disclosed, for example, in U.S. Pat. No. 5,734,605) is employed.

For overcoming the problem, there are proposals such as a diode-type architecture in which TMR cells and diodes are serially connected between bit lines and word lines (U.S. Pat. No. 5,640,343), and a simple-matrix architecture in which TMR cells are placed between bit lines and word lines (DE 19744095, WO 9914760).

However, in any case, the power consumption is large since magnetic reversal is preformed by a current magnetic field generated by a current pulse at the time of the writing, the number of integrated cells is limited since there is an allowable-current density limit of wiring, and the area of a driver circuit becomes large since the absolute value of write-in current may become as high as about 1 mA.

For this reason, there are many problems which should be improved for the conventional magnetic memories when compared with other non-volatilized solid state memories such as FeRAM (ferroelectric random access memory), a semiconductor flash memory, etc.

The solid magnetism storage in which a thin film made of a magnetic material of high permeability is provided in the surroundings of write-in wiring is proposed (U.S. Pat. Nos. 5,659,499, 5,956,267, the international patent application WO 00/10172, and U.S. Pat. No. 5,940,319).

According to such magnetic storage, since the high permeability magnetism film is provided in the circumference of wiring, a current required for the writing of the information on a magnetic-recording layer may be reduced.

However, in the magnetic storage which the U.S. Pat. No. 5,659,499 discloses, the magnetic field impressed to the record layer of a magnetoresistance effect film is uneven.

Moreover, when using the idea disclosed in the U.S. Pat. No. 5,956,267 and the U.S. Pat. No. 5,940,319, it is difficult to apply a magnetic field to a free layer efficiently with the structure where the free layer (record layer) is prepared in the central part of the magnetic layer which carried out laminating like a "dual spin valve type double tunnel junction."

On the other hand, by the magnetic storage currently indicated in the international patent application WO 00/10172, although it has the structure where a big magnetic field can be impressed at the free layer, the manufacture becomes very difficult.

As a result of an original examination of this inventor, it became clear that the magnetization state of this covering layer is very important when the covering layer formed in the circumference of write-in wiring.

That is, when the magnetization state of a covering layer was not controlled, it became clear that the current magnetic field from write-in wiring could not be efficiently impressed to the record layer of a magnetoresistance effect element.

Moreover, it became clear that a bad influence may arise in writing or read-out, if an asteroid curve is deformed by a magnetic interaction between the covering layer and the adjacent magnetoresistance effect elements depending on the direction of magnetization of the covering layer.

SUMMARY OF THE INVENTION

According to an embodiment of the invention, there is provided a magnetic memory comprising:

a magnetoresistance effect element having a magnetic recording layer;

a first wiring extending in a first direction on or below the magnetoresistance effect element;

a covering layer provided at least both sides of the first wiring, the covering layer being made of magnetic material, and the covering layer having a uniaxial anisotropy in the first direction along which a magnetization of the covering layer occurs easily; and a writing circuit configured to pass a current through the first wiring in order to record an information in the magnetic recording layer by a magnetic field generated by the current.

According to another embodiment of the invention, there is provided a magnetic memory comprising:

a first wiring extending in a first direction;

a magnetoresistance effect element provided on the first wiring and having a magnetic recording layer;

a second wiring extending in a direction across the first direction above the magnetoresistance effect element;

a covering layer provided on at least both sides of at least one of the first and second wirings, the covering layer being made of magnetic material, and the covering layer having a uniaxial anisotropy in a lengthwise direction of the wiring on which the covering layer is provided, along the lengthwise direction a magnetization of the covering layer occurring easily; and a writing circuit configured to pass currents through the first and second wirings in order to record one of two values of two-valued information in the magnetic recording layer by magnetic fields generated by the currents.

According to yet another embodiment of the invention, there is provided a magnetic memory comprising:

a first wiring extending in a first direction;

a magnetoresistance effect element provided on the first wiring and having a magnetic recording layer;

a second wiring extending in a direction across the first direction above the magnetoresistance effect element;

a covering layer provided on at least both sides of at least one of the first and second wirings, the covering layer being made of magnetic material a conductive layer adjoining an outer side of the covering layer taken from the adjoining wiring and being made of a conductive nonmagnetic material; and a writing circuit configured to pass currents through the first and second wirings in order to record one of two values of two-valued information in the magnetic recording layer by magnetic fields generated by the currents.

As explained in full detail above, according to this invention, mass magnetic memory with a super-low power and low current, and without a cross talk can be realized, and the merit on industry is great.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings:

FIGS. 15A through 17B are schematic diagrams showing the architectures of the cell using a switching transistor;

FIG. 18 is a schematic diagram showing the second example of the architecture which can be used in the embodiment of the invention;

FIGS. 19A through 20B are schematic diagrams showing the examples of the covering layer SM employable in the architecture of FIG. 18;

FIG. 21 is a schematic diagram showing the third example of the architecture where memory arrays can be stacked easily;

FIGS. 22A and 22B are schematic diagrams which illustrate the covering layer SM provided in the architecture of FIG. 21;

FIGS. 24A through 25B are schematic diagrams showing the covering layer SM which can be provided in the architecture of FIG. 23;

FIGS. 38 through 41 are tables showing the results of the samples of the embodiment and the comparative samples;

FIGS. 42 through 44 are tables showing the results of the case where FeMn and IrMn were added through Cu to each wirings;

FIGS. 45 and 46 are tables showing the results of the comparative samples;

FIGS. 47 through 50 are tables showing the results of the samples of the embodiment and the comparative samples;

FIGS. 51 and 52 are tables showing the results of comparative samples; and

FIGS. 53 through 55 are tables showing the results of the case where FeMn and IrMn were added through Cu to each wirings of the samples.

DETAILED DESCRIPTION

Some embodiments of the invention will now be explained below with reference to the drawings.

Figure 1:
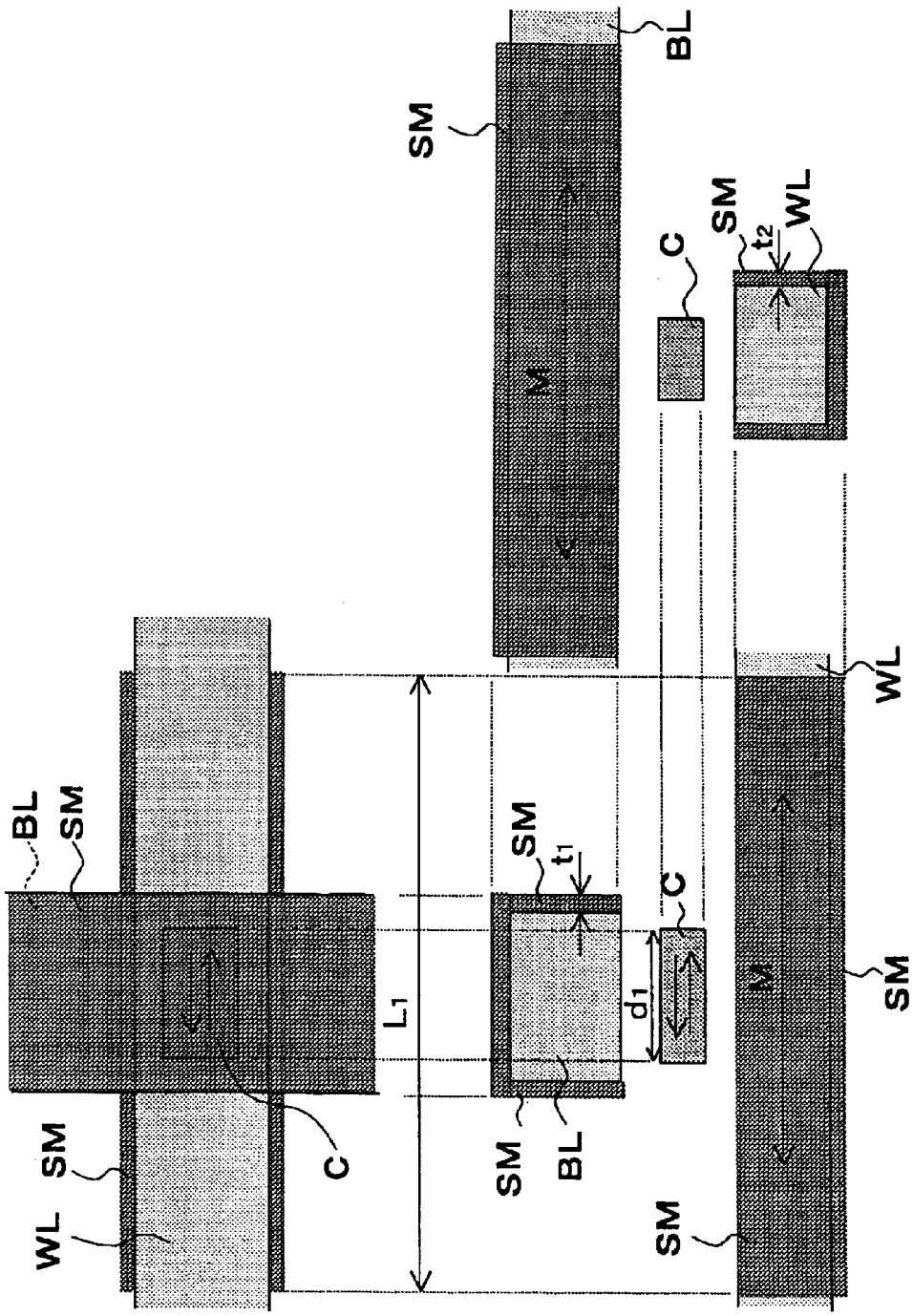
FIGS. 1A through 1C are schematic diagrams which simplify and express the principal part of the memory cell of the magnetic memory of the embodiment.

FIGS. 1A through 1C are schematic diagrams which simplify and express the principal part of the memory cell of the magnetic memory of the embodiment. That is, FIG. 1A is the front view showing a pair of write-in wiring and the magnetoresistance effect element which are contained in a memory cell, FIG. 1B is the plane view thereof, and FIG. 1C is the side view thereof.

In the magnetic memory of the embodiment, a pair of write-in wiring BL and WL which are directed in a crossing-fashion are formed in the upper and lower sides of the magnetoresistance effect element C. The magnetic-recording layer whose magnetization direction can be reversed by impressing a magnetic field is provided in the magnetoresistance effect element C.

By the synthetic magnetic field produced by passing write-in current to a pair of write-in wiring BL and WL, respectively, the magnetization direction of this magnetic-recording layer is reversed suitably, and "writing, i.e., information record," is performed.

A pair of write-in wirings BL and WL have the covering layer SM on their circumferences, and the covering layer is made of a magnetic material. The covering layer SM is formed on the both side of the wirings and the back side seen from and the magnetoresistance effect element C of each wiring, respectively, and has a role to prevent leakage of a magnetic field from.

That is, "the write-in cross talk" to other memory cells which adjoin in the right-and-left direction or the vertical direction by the current magnetic field produced from the write-in wirings BL and WL can be prevented by forming the covering layer SM.

Furthermore, such a covering layer SM itself becomes the so-called "magnetic yoke". Thus, the covering layer SM guides the current magnetic field produced around the write-in wirings BL and WL, and also has the effect to concentrate the magnetic field on the magnetic-recording layer of the magnetoresistance effect element C. As the result, write-in current is reduced and it also becomes possible to lower the power consumption of memory.

Now, in this embodiment, the magnetization easy direction M of the covering layer SM is formed in parallel to the lengthwise direction of the wirings BL and WL. If a uniaxial anisotropy is provided in the direction of a long axis of the wiring in the covering layer SM, the magnetic interaction with the magnetoresistance effect element C provided right under or above therefrom can be made small.

As the result, the "fluctuation" in the current magnetic field produced by write-in current can be suppressed, and influence of the cross talk on wiring can be made small.

If the magnetization direction of the covering layer SM is not specified, reversal action of the magnetization direction of the covering layer SM by the current magnetic field becomes unstable.

As a result, the write-in magnetic field impressed to the magnetic-recording layer of a magnetoresistance effect element becomes unstable.

Moreover, if the magnetization direction of the covering layer SM is suitable in the direction of the magnetoresistance effect element C, since a magnetic interaction arises, there is a possibility that an unstable phenomenon may arise in writing or read-out operation.

On the other hand, if the magnetization easy direction of the covering layer SM is specified in the lengthwise direction of the wirings BL and WL, these problems can be solved and the stable writing and read-out will become possible.

As a material of such a covering layer SM, it is desirable to use materials having a crystal magnetic anisotropy constant k1 not higher than $5 \times 10^4$ erg/cc.

Specifically, a nickel iron (nickel-Fe) alloy, a cobalt nickel (Co-nickel) alloy, or a cobalt iron nickel (Co-Fe-nickel) alloy can be used. Moreover, as the material of the covering layer SM, one of alloys including cobalt (Co) and at least one of zirconium, hafnium(Hf), niobium (Nb), tantalum (Ta), and titanium (Ti) can also be used (amorphous alloys can also be used).

Moreover, amorphous alloys such as (Co, Fe, nickel)-(Si, B)—(P, Al, Mo, Nb, Mn)-alloy system; metal-nonmetallic nano-granular materials such as (Fe, Co)—(B, Si, Hf, Zr, Sm, Ta, Al)—(F, O, N)-system, or insulating ferrites can also be used as the material of the covering layer SM.

For example, by choosing suitable target composition, a Permalloy (NiFe) film having a k1 of about $2 \times 10^3$ erg/cc, a CoNi film having a k1 of about $4 \times 10^4$ erg/cc, or a CoFeNi film having a K1 of about $1 \times 10^4$ erg/cc can be easily obtained by a sputtering process. In the embodiment, the thin film which consists of a single layer, or a laminated structure of two or more kinds of these films may be used for the covering layer SM.

In order to provide a uniaxial anisotropy in parallel to the lengthwise direction of the wirings BL and WL to the covering layer SM made of such material, it is necessary to specify the form of the covering layer SM to provide a magnetic layer thereto.

Figure 2:
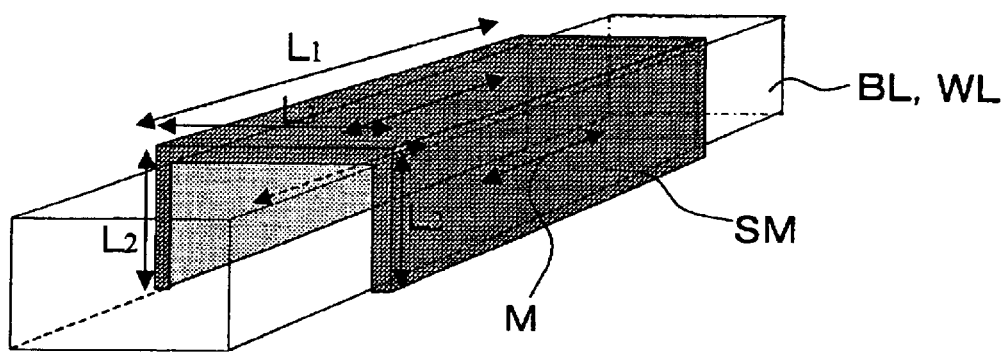
FIG. 2 is a schematic diagram showing the covering layer SM.

Here, as shown in FIG. 2, the sum total of the length of the covering layer SM in alignment with the circumference of the wirings BL and WL is expressed as (2L2+L3).

And the length of the covering layer SM of the direction of a long axis of the wirings BL and WL is expressed as L1.

In this case, if (2L2+L3) is made shorter than L1, a uniaxial anisotropy which met in the direction of a long axis will arise in the covering layer SM according to the form effect.

Furthermore, when the magnetic domain size of an actually used magnetic material is taken into consideration, it is still more desirable to set the sum total (2L2+L3) of the above-mentioned length of the covering layer SM to 1 micrometer or less. That is, if it is within the limits of this, it will be hard coming to generate the magnetization of those other than the direction of a wiring length axis.

On the other hand, if the length L1 of the covering layer SM of the direction of a long axis of the wirings BL and WL is made not smaller than 1.5 times of the length d1 of the magnetoresistance effect element on its longer axis, there can be substantially no influence of the stray magnetic field from the write-in wirings BL and WL, and a stable magnetic switching property can be acquired.

Moreover, if thickness t1 and t2 of the covering layer SM is set to 0.05 micrometers or less, the anti-magnetic field in its thickness direction will become large, and a magnetic anisotropy which met in its thickness direction may not be formed even at the time of annealing in a magnetic field.

As the result, influence of a magnetic interaction with the magnetoresistance effect element C of directly under or right above can be made small, the variation in the write-in magnetic field produced by write-in current is suppressed, and influence of the cross talk on wiring can be made small.

On the other hand, there is a method of dividing the covering layer SM into plurality parts provided in the circumference of the wirings BL and WL, as another method of obtaining uniaxial anisotropy by the form effect.

FIGS. 3A through 3E are cross-sectional diagrams which illustrate the wiring section which has the covering layer SM divided in this way. In the case of the example shown in FIG. 3A, on the both sides and the back of the wirings BL and WL, the covering layer SM is provided separately and independently.

Thus, if the covering layer SM is divided in the direction of the circumference of wiring, it becomes easy to make each covering layer SM into the "long and slender" form which met in the lengthwise direction of the wirings, and thus an uniaxial anisotropy which met in the direction of the longer axis of the wiring can be obtained easily.

In addition, since the write-in current magnetic field formed in the wirings BL and WL is flowed back through the inside of the covering layer SM around the wirings BL and WL, also in the "gap" of the divided covering layer SM, the magnetic flux passes through from the one edge to the adjoining edge of the covering layer SM.

Therefore, even if the covering layer SM is divided in this way, there is almost no fear of a magnetic field leaking to the circumference from the "gap."

Figures 3A, 3D:
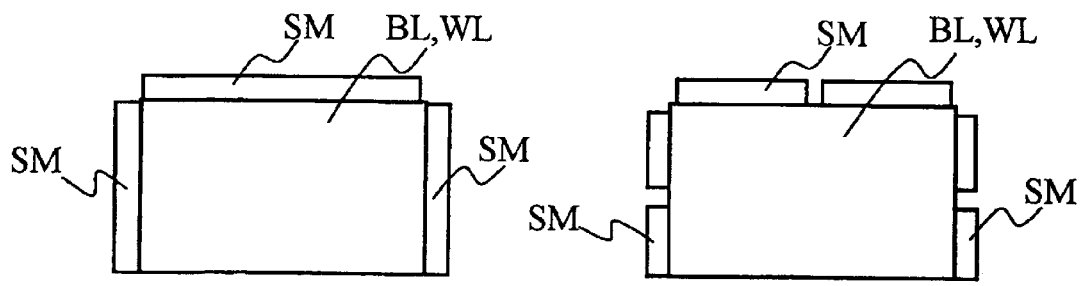
FIGS. 3A through 3E are cross-sectional diagrams which illustrate the wiring section which has the divided covering layer SM.
Figures 3B, 3E:
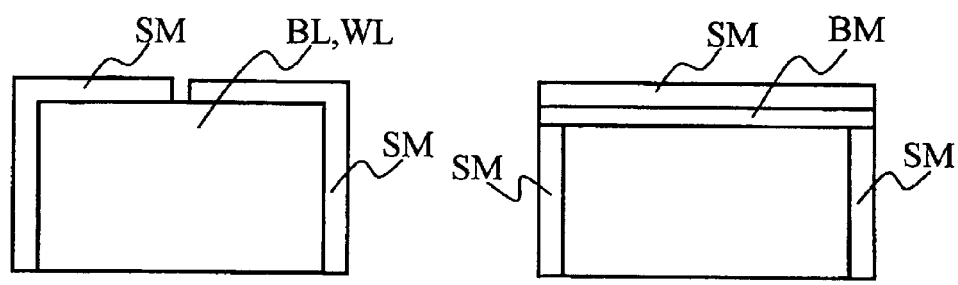

In the case of the example shown in FIG. 3B, the covering layer SM is divided into right hand side and left hand side of the wirings BL and WL. Thus, since the divided covering layer SM covers the corners of the wirings, it is more advantageous to reduce the leakage of the magnetic flux.

Figure 3C:
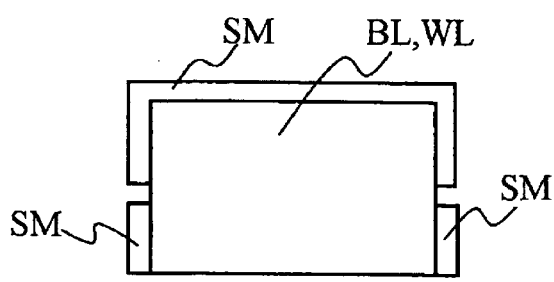

In the case of the example shown in FIG. 3C, the covering layer SM is divided in the side of the wirings BL and WL. Furthermore, in the case of the example of FIG. 3D, the covering layer SM is divided also in the back of the wirings.

In the case of the example of FIG. 3E, the barrier metal layer BM is formed on the wirings, and the covering layer SM is divide and provided on the both sides of the wirings, and on the barrier metal layer BM separately.

As mentioned above, as illustrated in FIGS. 3A through 3E, by dividing the covering layer SM in the direction of the circumference of the wirings BL and WL, it becomes easy to make the covering layer SM into "long and slender" form, and the uniaxial anisotropy which met in the direction of the wiring length axis can be obtained certainly and easily.

In order to fabricate the structures shown in FIGS. 3C and 3D, for example, after forming the wirings BL and WL, the covering layer SM may be formed in order from its bottom side.

In order to fabricate the structure shown in FIG. 3E, the laminating of the wiring and the barrier metal layer may be carried out first, then patterning process may be performed so that the side etching of the wiring proceeds.

Such a side etching may be possible by choosing the materials of the layers and by adjusting the etching condition of RIE (reactive ion etching), for example. Thus, the both ends of the barrier metal layer BM project outside wiring, and an overhang is formed. Then, if the covering layer SM is formed by methods, such as plating, the structure shown in FIG. 3E can be fabricated.

On the other hand, there is the way of carrying out the laminating of the layer which consists of the antiferromagnetic substance as a method of specifying the magnetization direction of the covering layer SM.

Figure 4A:
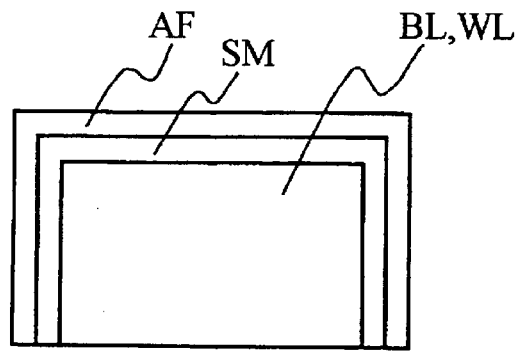
FIGS. 4A through 4D are the axial cross sectional diagrams showing the covering layer to which the laminating of the layer which consists of the antiferromagnetic substance is carried out.
Figure 4B:
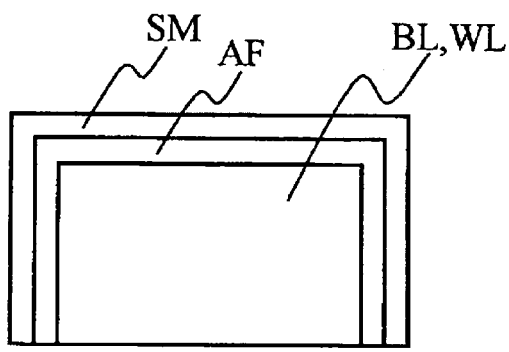

FIGS. 4A and 4B are the conceptual diagrams showing the covering layer to which the laminating of the layer which consists of the antiferromagnetic substance is carried out. That is, the laminating of the anti-ferromagnetic layer AF is carried out to the circumference of the covering layer SM which consists of the magnetic substance.

Thus, by carrying out the laminating of the anti-ferromagnetic layer AF, it is possible to fix the magnetization direction of a covering layer in the direction of a wiring length axis.

In this case, the outside of the covering layer SM may be made to carry out the laminating of the anti-ferromagnetic layer AF, as shown in FIG. 4A, or as shown in FIG. 4B, it may carry out laminating inside the covering layer SM.

Or the anti-ferromagnetic layer AF may be inserted between the covering layer SM.

Moreover, a non-magnetic layer may be inserted between the covering layer SM and the anti-ferromagnetic layer AF in order to adjust magnetic coupling with the covering layer SM and the anti-ferromagnetic layer AF.

Moreover, as illustrated in FIGS. 3A through 3E, the covering layer SM may be divided, and the laminating of the anti-ferromagnetic layer AF may be carried out to each of the divide parts of the covering layer.

By employing these structures, it becomes possible to obtain a still more stable uniaxial anisotropy.

When the anti-ferromagnetic layers AF are formed on each of a pair of write-in wirings BL and WL which cross substantially perpendicularly each other, the process which fixes the magnetization direction of each anti-ferromagnetic layer AF in each direction of the wiring length axes is required.

What is necessary for that may be to use different anti-ferromagnetic layers whose blocking temperature (temperature at which the coupling power between ferromagnetic/anti-ferromagnetic becomes zero) differs each other for the upper and lower wirings BL and WL, respectively.

That is, first, the magnetization direction of one of the anti-ferromagnetic layers can be fixed by cooling to a temperature lower than its blocking temperature during an annealing process while impressing a magnetic field parallel to the direction of a longer axis of the wiring on which the anti-ferromagnetic layer having a higher blocking temperature.

Then, the magnetization direction of another anti-ferromagnetic layer having the lower blocking temperature can be fixed by further cooling to a temperature lower than the blocking temperature of the anti-ferromagnetic layer formed on another wiring, impressing a magnetic field in the parallel direction to the direction of a longer axis of the wiring.

Such a method can be performed by using two kinds of antiferromagnetic substances whose blocking temperature differ 50 degrees C. or more. As some examples of the blocking temperatures of the antiferromagnetic substances, the blocking temperature of nickel manganese is 430 degrees C., the blocking temperature of platinum manganese is 360 degrees C., the blocking temperature of iridium manganese is 270 degrees C., and the blocking temperature of iron manganese is 150 degrees C.

Therefore, it is good to choose any two of these and to use for the upper and lower wirings BL and WL, respectively.

Moreover, if a material having a crystal magnetic anisotropy constant k1 (primary term) not higher than $5 \times 10^4$ erg/cc is used as the material of the covering layer SM, a uniaxial anisotropy can be certainly obtained in the wiring directions which intersect perpendicularly, respectively, by heating more than the blocking temperature of the antiferromagnetism layer AF and a ferromagnetic film.

Further, if the conditions as explained with reference to FIG. 2 are satisfied, more successful result can be achieved.

Thus, by reducing annealing temperature one by one according to the blocking temperatures, magnetization of the covering layers SM can be fixed in the directions of a wiring length axes about each of a pair of write-in wirings which intersect substantially perpendicularly. Moreover, it is desirable to provide a "barrier metal" which consists of tantalum nitride (TaN), silicon nitride (SiN), titanium nitride (TiN), etc. between these wirings and the covering layers SM or in the outside of the covering layer SM.

A non-magnetic layer which consists of copper (Cu) etc. may be inserted between the covering layer SM and an anti-ferromagnetic film, in order to adjust the magnetic interaction between the covering layer SM and the anti-ferromagnetic film so that the soft magnetic property may be optimized.

In the above, methods to introduce the uniaxial anisotropy to the covering layer SM has been explained.

On the other hand, in the embodiment, the electric conductive layer which consists of copper etc. can also be provided in the outside or inside the covering layer SM. This electric conductive layer acts as a seed layer at the time of forming the covering layer SM by methods, such as plating.

Figure 4C:
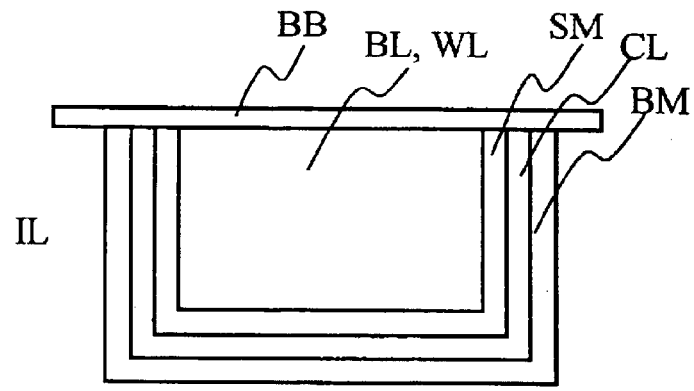
Figure 4D:
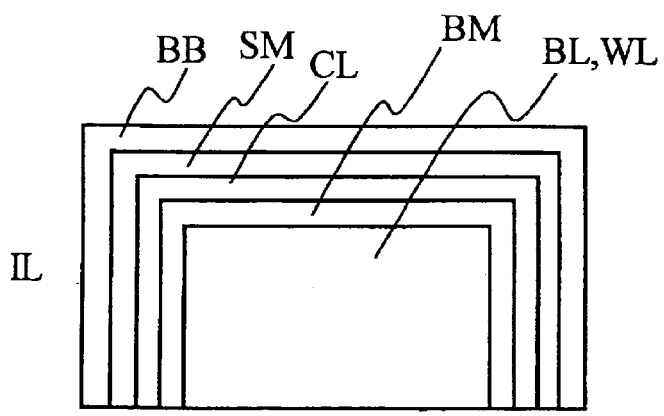

FIGS. 4C and 4D are diagrams showing the cross-sectional structures of the wiring which include such an electric conductive layer. Namely, FIG. 4C shows the case where the covering layer SM is formed in the outside of the bit line BL or a word line WL, and the electric conductive layer CL is formed in the circumference thereof. Furthermore, the barrier metal layer BM is formed in the outside of the electric conductive layer CL.

The circumference of the barrier metal layer BM can be embedded by the insulating layers IL, such as $SiO_2$. Here, the barrier metal layer BM may consist of TiN, TaN, etc., and has the role to prevent the diffusion of the materials, such as the covering layer SM, out to the circumference.

The wiring structure shown in FIG. 4C is advantageous when forming sequentially from the circumference. That is, a trench for the wiring is formed in the insulating layer IL, and the barrier metal layer BM is first formed in the inner wall of the trench. Then, the electric conductive layer CL is formed on the barrier metal layer BM. The electric conductive layer CL can be formed with copper etc.

Next, the covering layer SM which consists of the magnetic substance can be formed by a plating method on the conductive layer CL by using the conductive layer CL as a seed layer. Finally, the wiring BL (WL) is formed by a plating method etc. inside the covering layer SM.

According to the process explained above, island growth of the covering layer SM can be prevented by using the electric conductive layer CL as a seed layer. That is, a thin and uniform covering layer SM can be successfully formed by the plating method. Thus, a uniaxial anisotropy can be easily obtained by forming such thin and uniform covering layer SM.

On the other hand, in the case of the structure shown in FIG. 4D, the barrier metal layer BM is first formed in the outside of the bit line BL or a word line WL, and the electric conductive layer CL, the covering layer SM, and the barrier layer BB are formed in that outside in this order. The circumference of the covering layer SM is embedded by the insulating layer IL. The barrier layer BB can be formed by SiN etc.

The structure shown in FIG. 4D is suitable for the process formed sequentially from the inside wiring BL (WL). That is, the covering layer SM can be formed by a plating method on the surface of the electric conductive layer CL which consists of copper etc. by using the conductive layer CL as a seed layer in this case.

Also in this case, island growth of the covering layer SM can be prevented. That is, the thin and uniform covering layer SM can be formed by a plating method. Thus, a uniaxial anisotropy can be easily obtained by forming the thin and uniform covering layer SM.

In addition, the structure of FIG. 4C is suitable for the wiring formed at the lower side of the magnetoresistance effect element C.

On the other hand, the structure of FIG. 4D is suitable for the wiring formed at the upper side of the magnetoresistance effect element C.

In any of the cases shown in FIGS. 4C and 4D, the barrier metal layer BM and the barrier layer BB have a role to prevent a diffusion of the element which constitutes the covering layer SM into the insulating layer IL which embeds the circumference or a semiconductor device portion such as a MOS transistor provided in the lower part through the magnetoresistance effect element C.

In the above, the electric conductive layer CL provided in the outside or inside the covering layer SM has been explained. On the other hand, spin reversal with a low power and low current is further realizable by adding a projecting section to the covering layers SM. Such a projecting section may be formed to project towards the magnetoresistance effect element C.

Figure 5:
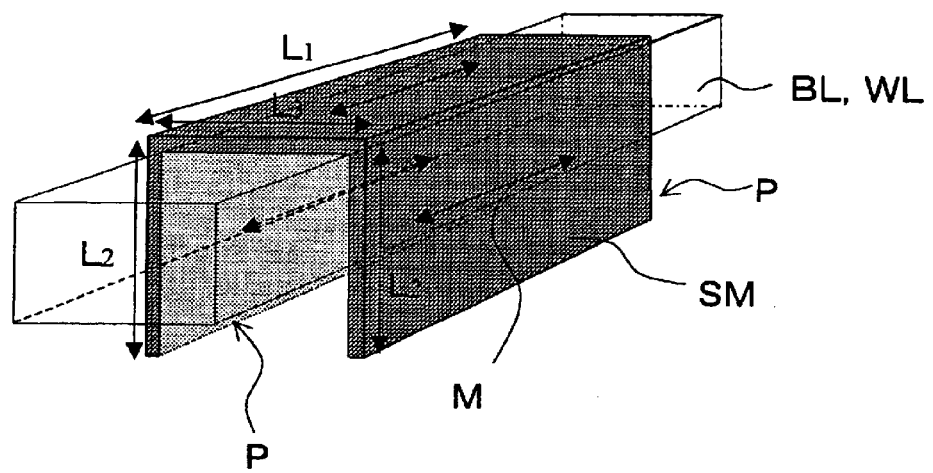
FIG. 5 is a schematic diagram which illustrates the covering layer which has such the projecting section.

FIG. 5 is a schematic diagram which illustrates the covering layer which has such the projecting section. That is, as shown in this figure, the projecting section P projected toward the direction of the magnetoresistance effect element C from the side of the write-in wiring BL and WL is formed.

If such the projecting section P is formed, the write-in magnetic field which is guided through the inside of the covering layer SM can be concentrated on the magnetization record layer of the magnetoresistance effect element C. That is, the covering layer SM in the embodiment acts as "a magnetic yoke", and guides the write-in magnetic field formed in the circumference of the wirings BL and WL. And by forming such the projecting section P, the emitting edge for the write-in magnetic field can be made to be able to approach the magnetic-recording layer of the magnetoresistance effect element C, and the magnetic field can be applied effectively.

Figure 6:
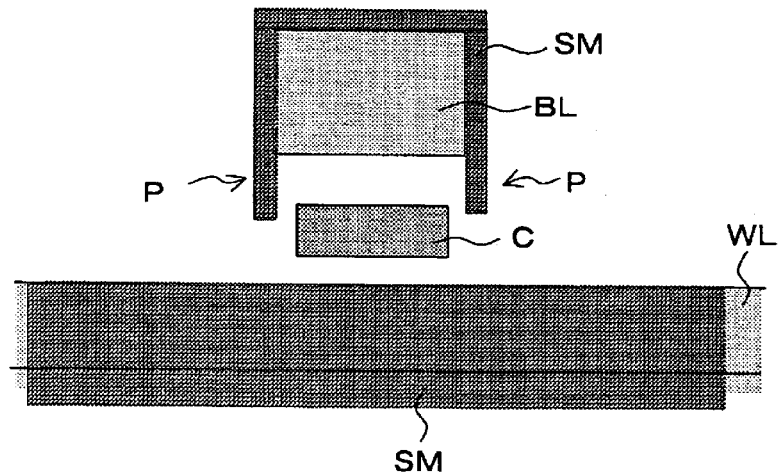
FIG. 6 is a schematic diagram showing the case where the projecting section P is formed at the covering layer SM of upper wiring.
Figure 7:
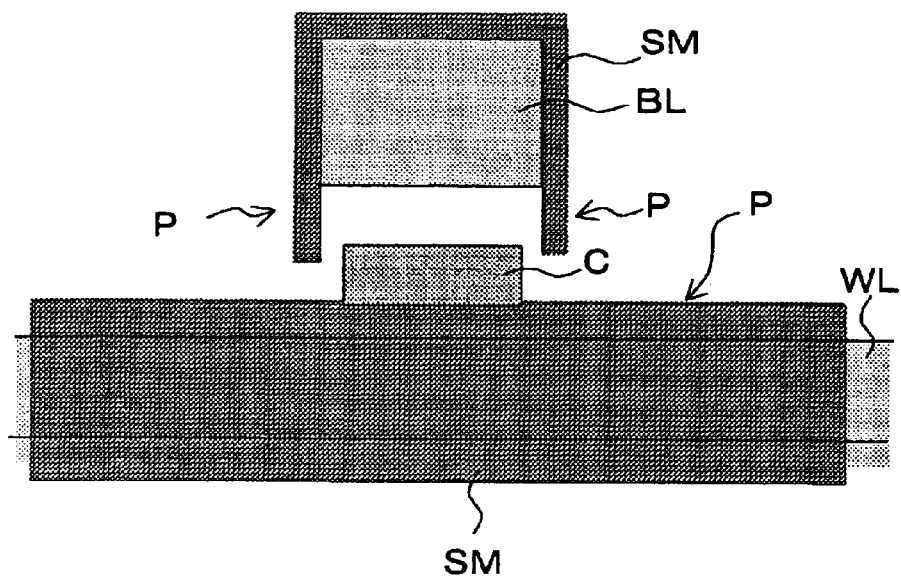
FIG. 7 is a schematic diagram showing the case where another projecting section P is also formed at the covering layer SM of lower wiring.

FIGS. 6 and 7 are schematic diagrams which illustrate the wiring BL and WL with the covering layer SM having the projecting section P, and a relation with the magnetoresistance effect element C. That is, in the case of the example of FIG. 6, the projecting section P is formed at the covering layer SM of upper wiring.

And in the case of the example of FIG. 7, another projecting section P is also formed at the covering layer SM of lower wiring. By providing these projecting sections at the covering layer SM like these examples, it becomes possible to bring the emitting edge of a write-in magnetic field close to the magnetoresistance effect element C, and current magnetic field efficiency rises while the write-in power consumption and the write-in current decrease.

Moreover, if write-in current is reduced in this way, since capacity of a drive circuit can also be made small and thickness of write-in wiring can also be made thin, the size of memory will be reduced and it will also become possible to raise the degree of integration.

Furthermore, by decreasing the write-in current, problems, such as electro migration in write-in wiring, can also be prevented, the reliability of magnetic memory can be raised, and a life of the memory can also be improved.

Such a projecting section P can be provided in the case as shown in FIGS. 3A through 3E. Namely, in these structures where the covering layer SM is divided into some portions, the projecting section P can be provided as well.

Figures 8A, 8B:
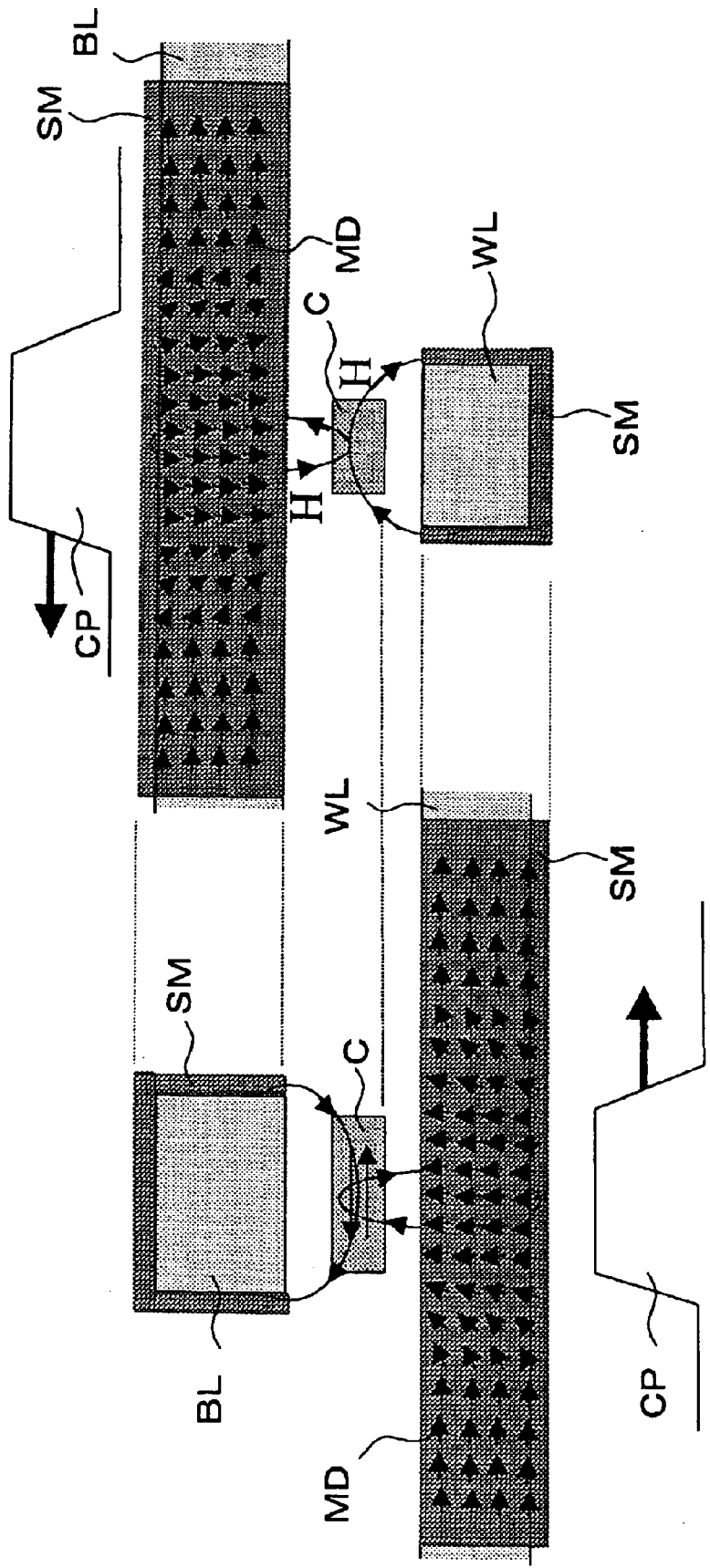
FIGS. 8A and 8B are schematic diagrams which illustrate change of the magnetic domain of a covering layer when applying a current pulse for writing.

FIGS. 8A and 8B are schematic diagrams which illustrate change of the magnetic domain MD of a covering layer when applying a current pulse for writing.

FIG. 8A is a diagram looking in a parallel direction to the bit line BL, and the FIG. 8B is a diagram looking in a parallel direction to the word line WL. If a current pulse CP passes the write-in wiring BL and WL, a magnetic wall will be formed in the covering layer SM corresponding to the width (it corresponds to application time) of a current pulse CP. And a magnetic field H is transmitted to the magnetoresistance effect element C effectively only at the place where a current pulse CP exists along the direction of a longer axis of the write-in wiring BL and WL. And the magnetic-recording layer of the magnetoresistance effect element C carries out magnetization reversal by the write-in magnetic field which is a combination of the magnetic fields H from upper and lower wirings.

As shown in FIGS. 8A and 8B, the magnetization direction of the above-mentioned magnetoresistance effect element does not necessarily need to be a straight line-like, and may be crooked by forming an "edge domain" etc. That is, the magnetization direction of a magnetic-recording layer changes to versatility according to the plane form thereof.

FIGS. 9A through 9F are conceptual diagrams which illustrate the plane forms and their magnetization direction of the recording layer RL. The recording layer RL of the magnetoresistance effect element C can have various plane form, as illustrated in these diagrams, and the magnetization M formed there forms various "edge domains" according to the form.

Figure 9A:
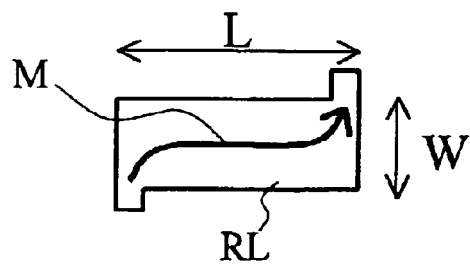
FIGS. 9A through 9F are conceptual diagrams which illustrate the plane forms and their magnetization direction of the recording layer RL.
Figure 9D:
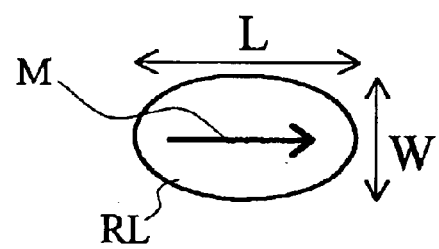

Namely, the magnetic recording layer RL may have a plane form where projects are added to both diagonal edges of a rectangular as shown in FIG. 9A. The magnetic recording layer RL may also have a plane form of a parallelogram as shown in FIG. 9B, a lozenge as shown in FIG. 9C, an ellipse as shown in FIG. 9D, an edge inclination shape as shown in FIG. 9E or an elongated octagon as shown in FIG. 9F.

Figure 9B:
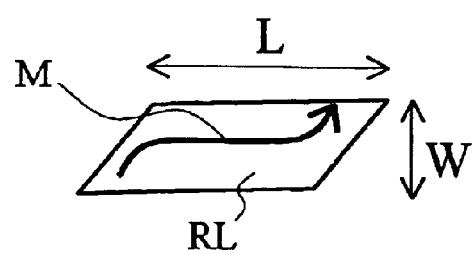
Figure 9E:
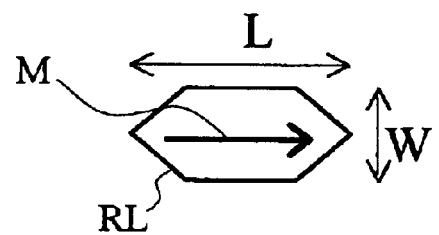
Figure 9C:
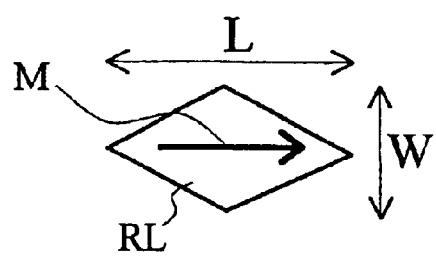
Figure 9F:
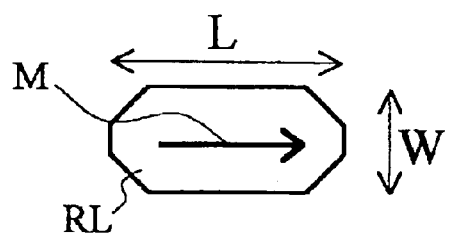

And in the case of the asymmetrical form as shown in FIGS. 9A and 9B, magnetization M is crooked by formation of the edge domain instead of the shape of a straight line. In the embodiment of the invention, it is possible to use the record layer which has the magnetization M crooked in this way.

Such asymmetrical form is easily produced by making the reticle used in photo lithography into asymmetrical form pattern. By forming the recording layer RL as shown in FIGS. 9A through 9F, a switching magnetic field can be reduced. According to examination of the Inventors, when the recording layer RL is formed as the elongated octagon as shown in FIG. 9F, it became possible to reduce the switching magnetic field notably.

In addition, although the angle parts are round in fact in many cases in the form where the magnetic recording layer RL is formed into the shapes as shown in FIGS. 9A–9C, 9E, and 9F when carrying out a patterning process. However, such rounded shape may be acceptable in the invention.

With regard to the ratio of the length L and the width W, L/W, of the magnetic recording layer RL of the magnetoresistance effect element C, it is desirable that the ratio L/W is larger than 1.2. And it is also desirable to give a uniaxial anisotropy in the direction of the length L. It is because the direction of magnetization M can be mutually specified in the two directions for the contraries certainly and easily.

Next, some examples of the laminating structure of the magnetoresistance effect element C which can be used for the magnetic memory of the embodiment of the invention are explained.

Figure 10:
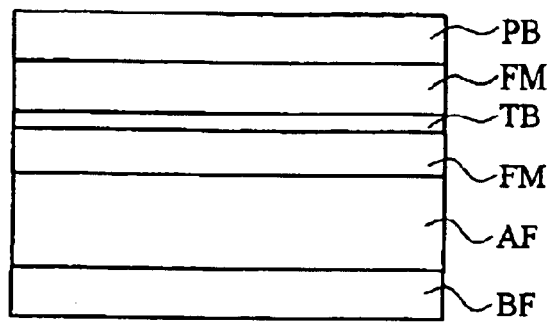
FIGS. 10 and 11 are conceptual diagrams showing the cross-sectional structures of the magnetoresistance effect element of having ferromagnetic single tunnel junction.
Figure 11:
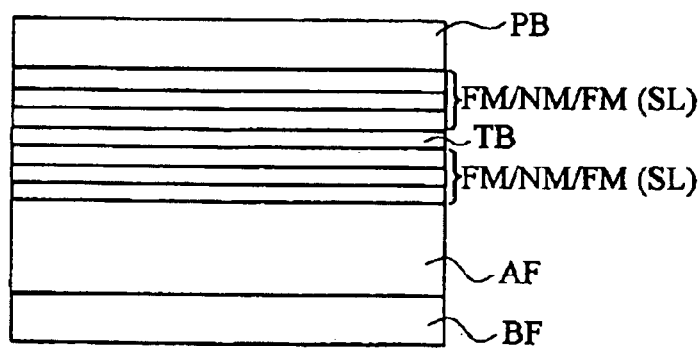

FIGS. 10 and 11 are a conceptual diagrams showing the cross-sectional structures of the magnetoresistance effect element of having ferromagnetic single tunnel junction. That is, in the case of the magnetoresistance effect element shown in FIG. 12, the laminating of the anti-ferromagnetic layer AF, the ferromagnetic layer FM1, the tunnel barrier layer TB, the ferromagnetic layer FM2, and the protection layer PB is carried out to this order on the ground layer BF.

The ferromagnetic layer FM1 which adjoins the anti-ferromagnetic layer AF acts as a magnetization pinned layer (pinned layer), and the ferromagnetic layer FM2 which is stacked on the tunnel barrier layer TB acts as a record layer (free layer).

Figure 13:
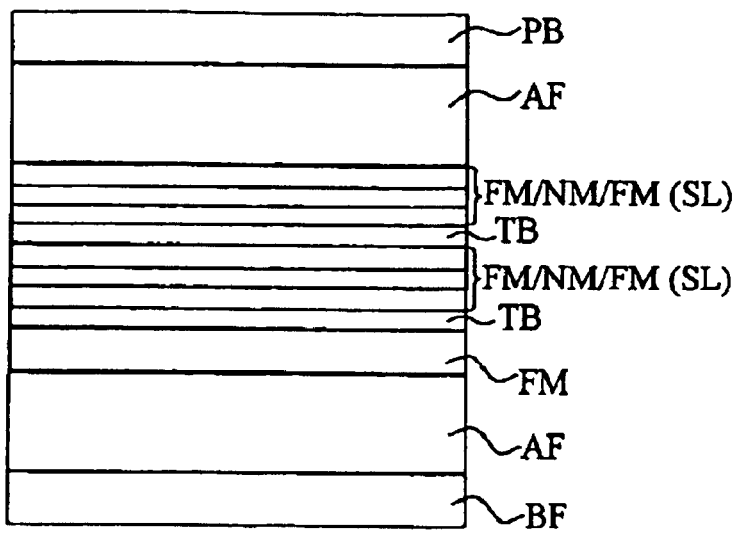

In the case of the magnetoresistance effect element shown in FIG. 13, in the upper and lower sides of the tunnel barrier layer TB, the stacked structures SL having the ferromagnetic layer FM, the non-magnetic layer NM, and the ferromagnetic layer FM are formed, respectively. In this case, the stacked structure SL interposed between the anti-ferromagnetic layer AF and the tunnel barrier layer TB also acts as a magnetization pinned layer, and the stacked structure SL provided on the tunnel barrier layer TB acts as a record layer.

Figure 12:
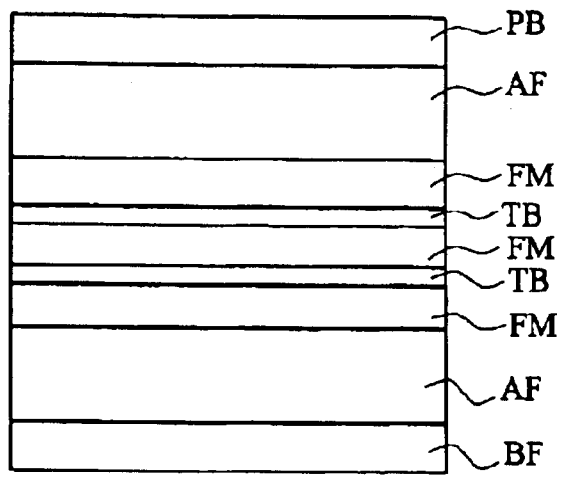
FIGS. 12 through 14 are conceptual diagrams which illustrate the cross-sectional structure of the magnetoresistance effect elements of having ferromagnetic double tunnel junctions.
Figure 14:
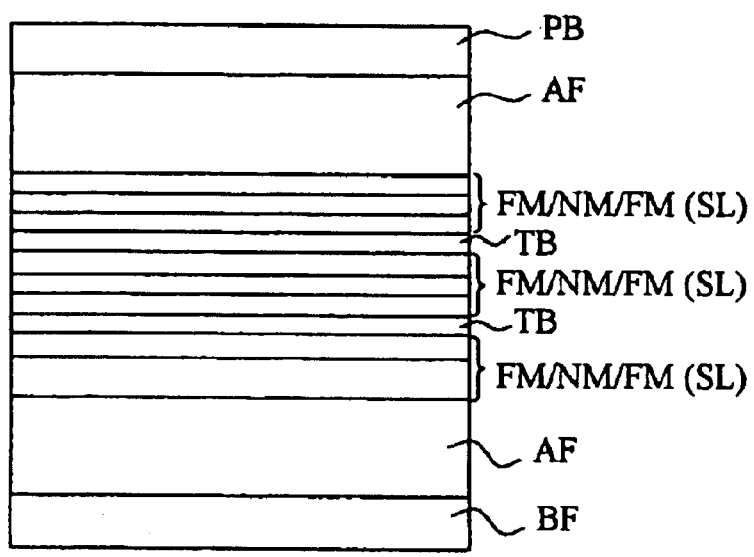

FIGS. 12 through 14 are conceptual diagrams which illustrate the cross-sectional structure of the magnetoresistance effect elements of having ferromagnetic double tunnel junctions. The same symbols are given to the same elements as what were mentioned with reference to FIGS. 10 and 11, and detailed explanation is omitted.

In the case of the structure illustrated in FIGS. 12 through 14, the two tunnel. barrier layers TB are formed, and the stacked structures SL of the ferromagnetic layer FM, or the ferromagnetic layer FM and the non-magnetism layer NM are formed in the upper and lower sides.

In the cases of the double tunnel junction element illustrated here, the ferromagnetic layers FM which adjoin the upper and lower anti-ferromagnetism layer AF respectively act as magnetization pinned layers, and the ferromagnetic layer FM provided between the two tunnel barrier layers TB acts as a record layer.

If such a double tunnel junction structure is adopted, it is advantageous at the point which can increase the current change with respect to the magnetization direction of a record layer.

In addition, the magnetoresistance effect element used in the magnetic memory of the invention is not limited to what was illustrated in FIGS. 10 through 14, but the so-called magnetoresistance effect element of the "spin valve structure" to which the laminating of the first ferromagnetic layer, a non-magnetism layer, and the second ferromagnetic layer is carried out can also be used.

Also when either structure is adopted as a magnetic resistance effect element, one ferromagnetic layer can be used as a "magnetization pinned layer" in which the magnetization direction is fixed substantially, and another ferromagnetic layer can be used as a "magnetic record layer" in which the magnetization direction is controllable by applying a magnetic field from the outside.

Moreover, the ferromagnetic layer formed to adjoin the anti-ferromagnetic layer can also be used as a record layer depending on the read-out method, as explained in full detail below.

As the ferromagnetic material which can be used as a magnetization pinned layer in these magnetoresistance effect elements, for example, Fe (iron), Co (cobalt), nickel (nickel), or these alloys, magnetite having a large spin polarization ratio, $CrO_2$, or $RXMnO_{3-y}$ (where R expresses a rare earth element, and X expresses calcium (calcium), Ba (barium), or Sr (strontium)) can be used.

Further, as the ferromagnetic material which can be used as a magnetization pinned layer in these magnetoresistance effect elements, Heusler alloys, such as NiMnSb (nickel manganese antimony), PtMnSb (platinum manganese antimony), $Co_2MnGe$, and $Co_2MnSi$, can be used.

As for the magnetization pinned layer which consists of such material, it is desirable to have unidirectional anisotropy.

With regard to the thickness of these layers, it is desirable to range between 0.1 nm and100 nm. Furthermore, in order to prevent the superparamagnetizm, it is more desirable to make the thickness not smaller than 0.4 nm.

Moreover, it is desirable to provide an anti-ferromagnetic film near the magnetization pinned layer in order to fix the magnetization thereof. As such an anti-ferromagnetic film, Fe (iron)-Mn (manganese), Pt (platinum)-Mn (manganese), Pt (platinum)-Cr (chromium)-Mn (manganese), Ni (nickel)-Mn (manganese), Ir (iridium)-Mn (manganese), Os (osmium)-Mn (manganese), NiO (oxidization nickel) and $Fe_2O_3$ (iron oxide), or magnetic semiconductors can be mentioned.

Moreover, in these magnetic materials, non-magnetic elements such as Ag (silver), Cu (copper), Au (gold), Al (aluminum), Mg (magnesium), Si (silicone), Bi (bismuth), Ta (tantalum), B (boron), C (carbon), O (oxygen), N (nitrogen), Pd (palladium), Pt (platinum), Zr (zirconium), Ir (iridium), W (tungsten), Mo (molybdenum), Nb (niobium), or H (hydrogen) can be added in order to adjust the magnetic properties, or other various properties, such as crystallinity, mechanical properties, and the chemical properties.

On the other hand, a stacked structure having a ferromagnetic layer and a non-magnetic layer can be used as a magnetization pinned layer. For example, the three-layered structure of the (ferromagnetic layer)/(nonmagnetic layer)/(ferromagnetic layer) which is illustrated in FIG. 11 etc. can be used. In this case, it is desirable to make an anti-ferromagnetic interaction work between the ferromagnetic layers on both sides through the non-magnetic layer.

As a specific method to fix the magnetization of the magnetic layer in one direction, three-layered structure such as Co(Co—Fe)/Ru/Co(Co—Fe), Co(Co—Fe)/Ir/Co(Co—Fe), Co(Co—Fe)/Os/Co(Co—Fe) and (ferromagnetic layer)/(magnetic semiconductor nonmagnetic layer)/(magnetic semiconductor ferromagnetic layer) can be used. In this case, it is desirable to provide an anti-ferromagnetic layer to adjoin the three-layered structure.

As such an anti-ferromagnetic layer, Fe—Mn, Pt—Mn, Pt—Cr—Mn, Ni—Mn, Ir—Mn, NiO, $Fe_2O_3$ and magnetic semiconductors can be used. By employing this structure, magnetization of the magnetization pinned layer can be fixed securely, a stray field from the magnetization pinned layer can be reduced (or controlled), and magnetization shift can be controlled by changing the thicknesses of the two ferromagnetic layers of the magnetization pinned layer.

On the other hand, as the material of a magnetic record layer (free layer), the same as the magnetization pinned layer can be used. For example, Fe (iron), Co (cobalt), nickel (nickel), or these alloys, magnetite having a large spin polarization ratio, $CrO_2$, or $RXMnO_{3-y}$ (where R expresses a rare earth element, and X expresses calcium (calcium), Ba (barium), or Sr (strontium)) can be used. Further, as the ferromagnetic material which can be used as a magnetic record layer in these magnetoresistance effect elements, Heusler alloys, such as NiMnSb (nickel manganese antimony), PtMnSb (platinum manganese antimony), $Co_2MnGe$, and $Co_2MnSi$, can be used.

The ferromagnetic layer as the magnetic record layer made of these materials may desirably have a uniaxial anisotropy parallel to its film plane. With regard to the thickness of these layers, it is desirable to range between 0.1 nm and100 nm. Furthermore, in order to prevent the superparamagnetizm, it is more desirable to make the thickness not smaller than 0.4 nm.

Alternatively, a two-layered structure of (soft magnetic layer)/(ferromagnetic layer), or a three-layered structure of (ferromagnetic layer)/(soft magnetic layer)/(ferromagnetic layer) can be used as the magnetic record layer.

By using a three-layered structure of (ferromagnetic layer)/(nonmagnetic layer)/(ferromagnetic layer), or five-layered structure of (ferromagnetic layer)/(nonmagnetic layer)/(ferromagnetic layer)/(nonmagnetic layer)/(ferromagnetic layer) as the record layer, and by adjusting the strength of the interaction between the ferromagnetic layers, it becomes possible to suppress an increase of a power consumption even if the cell width of the record layer as the memory cell becomes sub-micron.

In the case of the five-layered structure, the intermediate ferromagnetic layer may desirably be a soft magnetic layer, or a ferromagnetic layer which is divided by a non-magnetic.

It is also noted that in the case of the record layer, in these magnetic materials, non-magnetic elements such as Ag (silver), Cu (copper), Au (gold), Al (aluminum), Mg (magnesium), Si (silicone), Bi (bismuth), Ta (tantalum), B (boron), C (carbon), O (oxygen), N (nitrogen), Pd (palladium), Pt (platinum), Zr (zirconium), Ir (iridium), W (tungsten), Mo (molybdenum), Nb (niobium), or H (hydrogen) can be added in order to adjust the magnetic properties, or other various properties, such as crystallinity, mechanical properties, and the chemical properties.

On the other hand, when a TMR element is used as the magnetoresistance effect element, $Al_2O_3$ (aluminum oxide), $SiO_2$ (silicone oxide), MgO (magnesium oxide), AlN (aluminum nitride), $Bi_2O_3$ (bismuth oxide), $MgF_2$ (magnesium fluoride), $CaF_2$ (calcium fluoride), $SrTiO_2$ (titanium strontium oxide), $AlXO_3$ (X is rare earth elements, such as La, Hf, and Er), Al—N—O (aluminum nitride oxide), a non-magnetic semiconductor (InMn, GaN, GaAs, $TiO_2$, Zn, Te and these doped with transition metal), etc. can be used as the material of the tunnel barrier layer TB prepared between a magnetization pinned layer and a magnetization record layer.

These compounds may not necessarily have a perfect stoichiometric composition, but may have deficiency or excess of the component elements such as oxygen, nitrogen and fluoride. Moreover, the insulated layer (dielectric layer) may preferably thin enough to make a tunneling current flow therethrough. The practical thickness may preferably equal to or smaller than 10 nm.

Such a magnetoresistance effect element can be formed on a predetermined substrate using the usual thin film formation means, such as various sputtering methods, vapor-depositing method, the molecule beam epitaxy, and CVD method.

As a substrate in this case, various kinds of substrates, such as Si (silicone), $SiO_2$ (oxidization silicone), $Al_2O_3$ (aluminum oxide), spinel, AlN (aluminum nitride), GaAs, and GaN, can be used, for example. Moreover, as a base layer of a protective layer, such as Ta (tantalum), Ti (titanium), Pt (platinum), Pd (palladium), Au(gold), Ti/Pt, Ta/Pt, Ti/Pd, Ta/Pd, Cu (copper), Al—Cu, Ru (ruthenium), Ir (iridium) and Os (osmium), GaAs, GaN, ZnO, $TiO_2$, etc. can be used.

Moreover, as the material of the ferromagnetic layers, elements, such as Pt and Pd, may be added into Fe, Co, Ni, or these alloys in order to form a semi-hardmagnetic film.

In the above, the basic structure of the magnetoresistance effect element C in the magnetic memory of the embodiment and their materials are explained.

Next, some examples are given and explained about the cell structure of the magnetic memory of the embodiment.

Figures 15A, 15B:
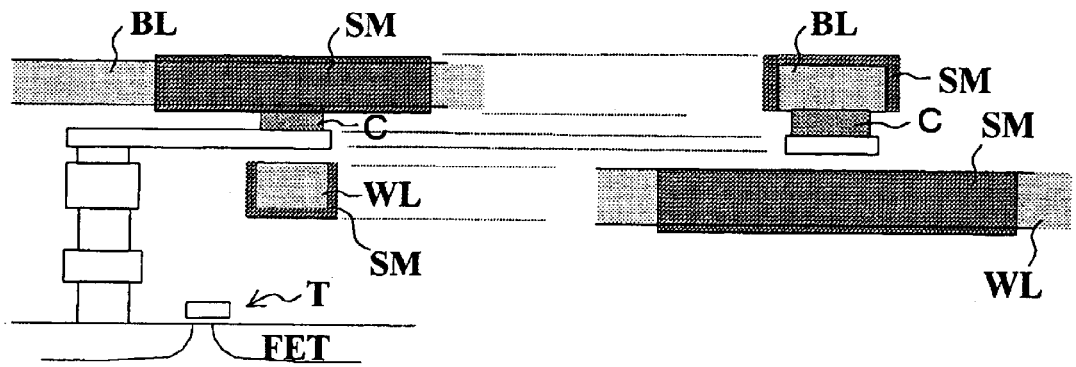

FIGS. 15A through 17B are schematic diagrams showing the architecture of the cell using a switching transistor. That is, FIGS. 15A, 16A and 17A are diagrams looking in a perpendicular direction to the bit line BL, and FIGS. 15B, 16B and 17B are diagrams looking in a perpendicular direction to the word line WL.

When MOSFET (Metal-Oxide-Semiconductor Field Effect Transistor) is used as a switching transistor, read-out is performed by turning the lower selection transistor T on, and by flowing a sense current in the bit line BL through the magnetoresistance effect element C.

On the other hand, writing is performed by using the bit line BL and word line WL which intersect perpendicularly. And the covering layer SM to which a uniaxial anisotropy is added as mentioned above with reference to FIGS. 1A through 8B is provided on these bit line BL and the word line WL.

Figures 16A, 16B:
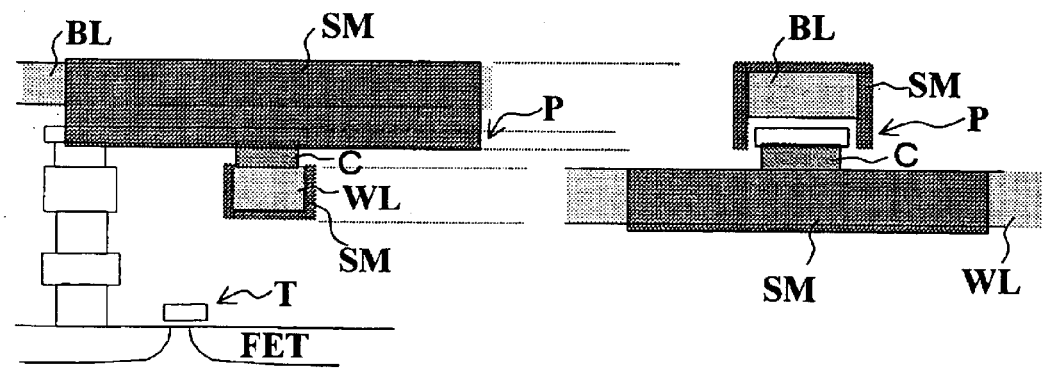

In the case of the example shown in FIGS. 16A and 16B, the projecting section P is added to the covering layer SM for both the bit line BL and a word line WL. Therefore, the edge of the covering layer SM becomes closer to the magnetoresistance effect element C, and write-in can be performed with a lower power and lower current.

In the case of the example shown in FIGS. 17A and 17B, the projecting section P of the covering layer SM is divided, and provided separately from the main part. That is, the projecting section P dissociates from the main part of the covering layer SM on the bit line BL, and is formed at the side of the bit line RBL for read-out connected to the magnetoresistance effect element C.

The length of the covering layer in a direction of the circumference of the bit line BL tends to become longer if the projecting section P is added without a gap.

On the other hand, a uniaxial anisotropy can be more easily obtained by a form effect, by providing the projecting section P separately like this example. In order to realize further super-large scale-integrated memory, it is desirable to employ a multilayered architecture which can laminate memory arrays.

Next explained is some architectures where lamination of the memory arrays is easy.

FIG. 18 is a schematic diagram showing the second example of the architecture which can be used in the embodiment. That is, this figure shows the cross-sectional structure of a memory array. In the case of this architecture, the magnetoresistance effect elements C are connected to read-out/write-in bit line BL in parallel through Diodes D. And read-out/write-in word lines WL are connected to the other edges of each magnetoresistance effect elements C.

At the time of read-out, the bit line BL and word line WL which are connected to the target magnetoresistance effect element C are chosen with the selection transistor ST, and a sense amplifier SA detects current at the element C.

On the other hand, at the time of writing, the bit line BL and word line WL which are connected to the target magnetoresistance effect element C are also chosen with the selection transistor ST, and write-in current is passed through them. In this case, the magnetic fields generated respectively by the bit line BL and the word line WL are combined to form the synthetic write-in magnetic field. And writing is attained by the synthetic magnetic field by turning magnetization of a magnetic-recording layer in the predetermined direction.

Diode D has a role to intercept the detour current which flows through other magnetoresistance effect elements C currently wired in a matrix at the time of these read-out or writing.

FIGS. 19A through 20B are schematic diagrams showing the examples of the covering layer SM employable in the architecture of FIG. 18. In these drawings, in order to simplify the example, only the bit line BL, the magnetoresistance effect element C, Diode D, and the word line WL are expressed, and elements other than these are omitted.

In the memory cell of these examples, writing is performed using the bit line BL and word line WL which intersect perpendicularly. The covering layer SM mentioned above with regard to FIGS. 1A through 8B is formed on the bit line BL and a word line WL, and the projecting section P is further formed.

In the case of the example of FIG. 20, the projecting section P is provided apart from the main part of the covering layer SM so that the section P comes in the side of Diode D, therefore a uniaxial anisotropy can be obtained more certainly.

The following methods can be used as the formation method of such the projection section P. That is, Diode D is formed first. Then, an insulating layer is deposited on the upper surface and side thereof, and a material of the projecting section P is deposited on the insulating layer. Then, the insulating layer and the material of the projecting section P is removed on the diode D by a polishing process such as CMP. Next, the third example of architecture employable as the magnetic memory according the embodiment is explained.

FIG. 21 is a schematic diagram showing the third example of the architecture where memory arrays can be stacked easily. That is, this figure expresses the cross-sectional structure of a memory array. In this architecture, a configuration of a "ladder type" is employed where two or more magnetoresistance effect elements C are connected in parallel between read-out/write-in bit line BL and the bit line Br for read-out.

Write-in word lines WL are provided near each magnetoresistance effect element C and are provided in a direction to intersect the bit lines. The writing to a magnetoresistance effect element can be performed by generating magnetic fields by passing current through the read-out/write-in bit line BL, and by passing current through the write-in word line WL, and thus a synthetic magnetic field is applied to the magnetic-recording layer of the magnetoresistance effect element C. On the other hand, in the case of read-out, a voltage is applied between the bit lines BL and Br.

Then, current flows for all the magnetoresistance effect elements C connected in parallel among these. While a sense amplifier SA detects the sum total of this current, a write-in current is passed through the word line WL close to the target magnetoresistance effect element so that the magnetization of the magnetic-recording layer of the target magnetoresistance effect element is rewritten in the predetermined direction.

A read-out of the target magnetoresistance effect element can be performed by detecting the change in the sense current at this rewriting process. That is, if the magnetization direction before the rewriting process is same as the magnetization direction after the rewriting process, the current detected by the sense amplifier SA will not change. However, if the magnetization direction before the rewriting process is different from the magnetization direction after the rewriting process, the current detected by the sense amplifier SA changes by a magnetoresistance effect.

Thus, it becomes possible to read the magnetization direction of a magnetic-recording layer before the rewriting process, i.e., stored data. However, this method corresponds to so-called "destructive reading" by which storing data are changed at the time of read-out.

On the other hand, when the magnetoresistance effect element is made to have a structure of a magnetization free layer/insulating layer (non-magnetic layer)/magnetic-recording layer, the so-called "nondestructive readout" is possible. That is, when using the magnetoresistance effect element of this structure, the write-in is performed by recording the magnetization direction on the magnetic-recording layer, and the read-out is performed by comparing the sense current while changing the magnetization direction of a magnetization free layer suitably. In this way, the magnetization direction of the magnetic-recording layer can be read-out without changing it.

However, in this case, it is necessary to design so that the way of the magnetization reversal magnetic field of a magnetization free layer may become smaller compared to the magnetization reversal magnetic field of the magnetic-recording layer.

FIGS. 22A and 22B are schematic diagrams which illustrate the covering layer SM provided in the architecture of FIG. 21. Here, in order to simplify the example, only the bit line BL, the magnetoresistance effect element C, and the word line WL are expressed, and elements other than these are omitted.

Also in the example shown in FIGS. 22A and 22B, writing is performed using the bit line BL and word line WL which intersect perpendicularly. And by forming the covering layer SM in these lines, a write-in cross talk can be reduced, and writing process can be performed with a lower power and lower current.

Next, the fourth example of architecture employable as the magnetic memory of the embodiment is explained.

Figure 23:
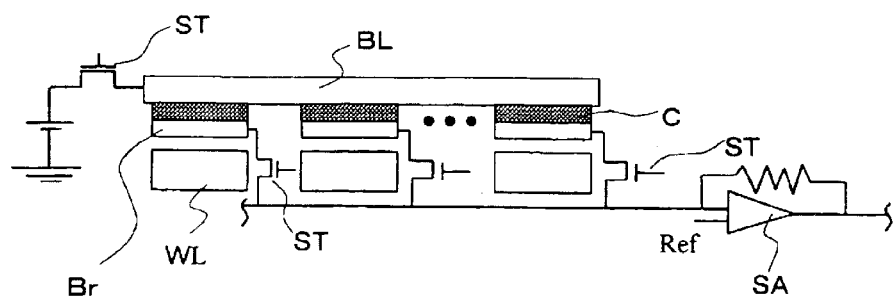
FIG. 23 is a schematic diagram showing the fourth example of the architecture where lamination of memory arrays is easier.

FIG. 23 is a schematic diagram showing the fourth example of the architecture where lamination of memory arrays is easier. That is, this figure expresses the cross-sectional structure of a memory array. In this architecture, two or more magnetoresistance effect elements C are connected to read-out/write-in bit line BL in parallel, and the bit lines Br for read-out are connected to the other edges of these magnetoresistance effect elements in the shape of a matrix, respectively.

Furthermore, the word lines WL for writing are wired near the bit lines B. The writing to a magnetoresistance effect element can be performed by making the synthetic magnetic field of the magnetic field generated by passing current through the bit line BL and the magnetic field generated by passing current through the word line WL, and thus applying the synthetic magnetic field to the magnetic-recording layer of the magnetoresistance effect element C.

On the other hand, in the case of read-out, by choosing the bit lines BL and Br with the selection transistor ST, sense current can be passed for the target magnetoresistance effect element, and the sense current is detected by the sense amplifier SA.

Figures 24A, 24B:
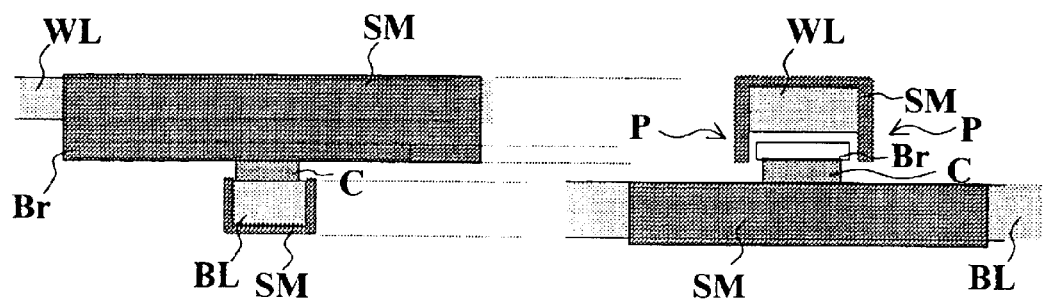
Figures 25A, 25B:
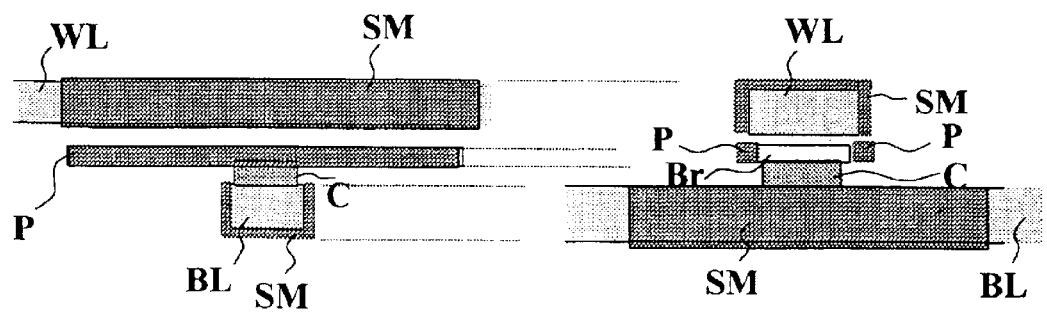

FIGS. 24A through 25B are schematic diagrams showing the covering layer SM which can be provided in the architecture of FIG. 23. That is, FIGS. 24A and 25A are diagrams looking in a parallel direction to the bit line BL, and FIGS. 24B and 25B are diagrams looking from in a parallel direction to the word line WL.

FIGS. 24A through 25B express the state where the vertical relation was reversed with regard to FIG. 23. Also in these drawings, only the bit lines BL and Br, the magnetoresistance effect element C, and the word line WL are expressed, and elements other than these are omitted for simplification.

As shown in FIGS. 24A and 24B, the covering layer SM which has a uniaxial anisotropy is formed on the bit line BL and a word line WL, and the projecting section P is further formed for the word line.

By employing such a structure, a cross talk can be reduced and write-in can be performed with a lower power and lower current. Moreover, in the case of the example shown in FIGS. 25A and 25B, the projecting section P is provided separately for the word line WL. That is, with the covering layer SM prepared in the circumference of a word line WL, this projecting section P dissociates and is formed in the side of the bit line Br. Thus, it becomes easy to produce a uniaxial anisotropy by a form effect.

Next, the fifth example of architecture employable as the magnetic memory of the embodiment is explained.

Figure 26:
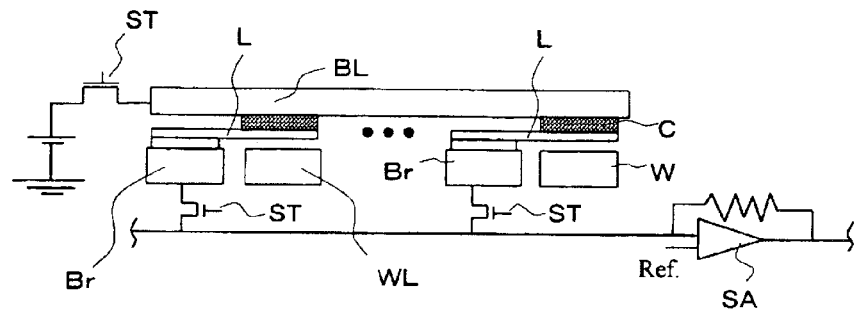
FIG. 26 is a schematic diagram showing the fifth example of the architecture which can be used in the embodiment.

FIG. 26 is a schematic diagram showing the fifth example of the architecture which can be used in the embodiment. That is, this figure expresses the cross-sectional structure of a memory array. In the case of this example, the bit lines Br for read-out are connected to the magnetoresistance effect elements C through leads L, and the word lines WL for writing are wired directly under the magnetoresistance effect elements.

Figures 27A, 27B:
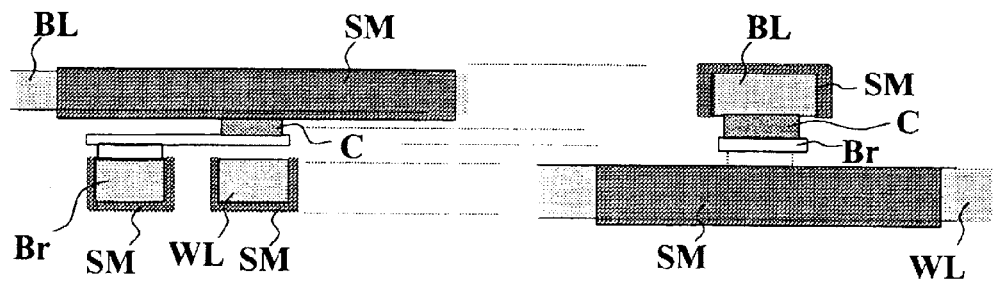
FIGS. 27A and 27B are schematic diagrams showing the example of the covering layer in the architecture of FIG. 26.

FIGS. 27A and 27B are schematic diagrams showing the example of the covering layer in the architecture of FIG. 26. Also in this figure, only the bit line BL, the magnetoresistance effect element C, and the word line WL are expressed, and elements other than these are omitted for simplification.

Thus, by forming the covering layer SM which has a uniaxial anisotropy to the bit line BL and a word line WL, a write-in cross talk can be reduced, writing and read-out operation becomes stable, and writing can be performed with a lower power and lower current.

Figure 28:
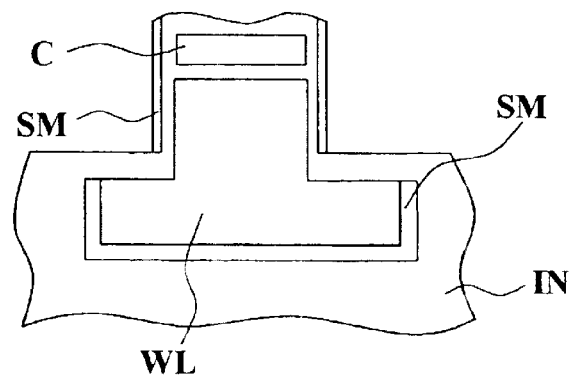
FIGS. 28 and 29 are schematic diagrams showing the further modified examples of the covering layer which can be used in the embodiment of the invention.
Figure 29:
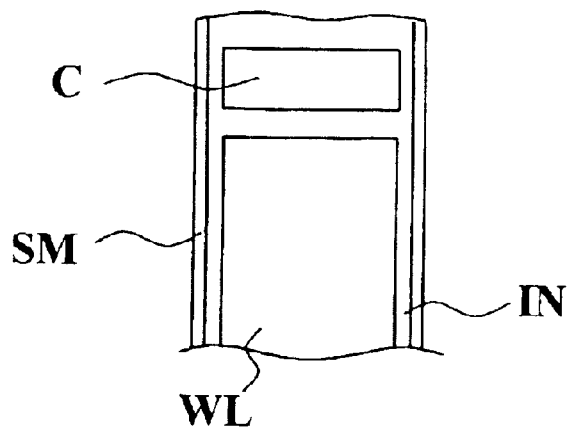

FIG. 28 and 29 are schematic diagrams showing the further modified example of the covering layer which can be used in the embodiment. That is, as illustrated in these drawings, the magnetoresistance effect element C is embedded with Insulator IN, and the covering layer SM is formed to cover both sides of the element C.

FIGS. 30 through 37 are schematic cross-sectional diagrams showing the structure where laminating of the architectures shown in FIGS. 18 through 27B is carried out. The same sign is given to the same element as what was mentioned above with regard to FIGS. 1A through 29 about these figures, and detailed explanation is omitted.

Figure 30:
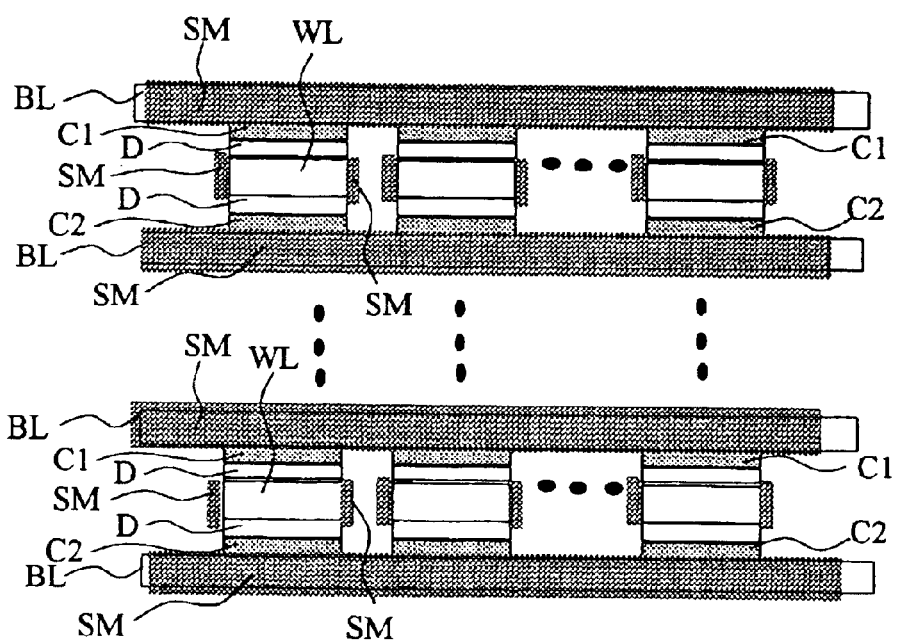
FIGS. 30 through 37 are schematic cross-sectional diagrams showing the structure where laminating of the architectures shown in FIGS. 18 through 27B is carried out.
Figure 31:
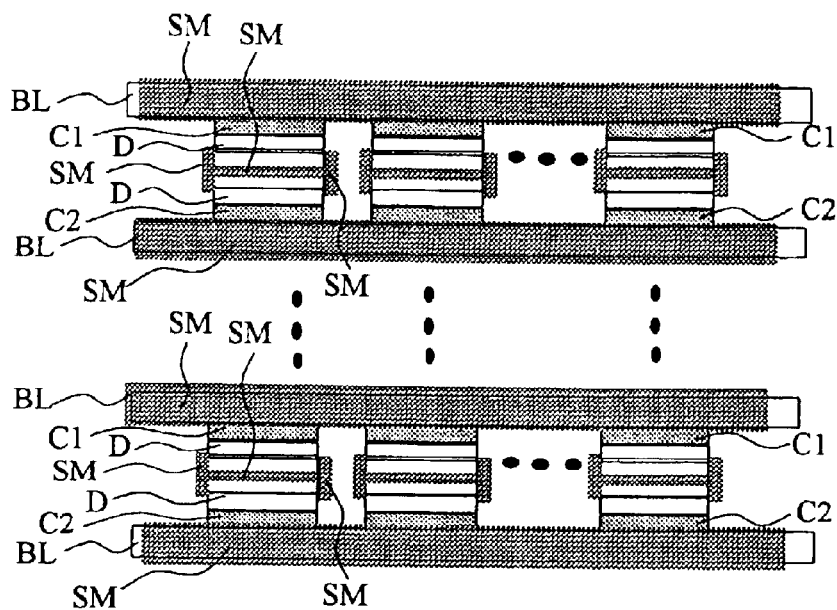

First, FIGS. 30 and 31 show the structures where the laminating of the architectures mentioned above about FIGS. 18 through 20B is carried out. In the case of the example of FIG. 30, since the write-in word line WL is used in common to the magnetoresistance effect elements C1 and C2 of the upper and lower sides, the covering layer SM is formed only in the sides thereof.

Also in this case, a stable recording and reproduction can be possible by giving the uniaxial anisotropy to the covering layer SM in the lengthwise direction of the wiring.

On the other hand, in the case of the example shown in FIG. 31, the covering layer SM is inserted in the word line WL. This covering layer SM intercepts the write-in magnetic field generated from the upper and lower bit lines BL, and has the role to controls the write-in cross talk between the upper and lower cells.

Moreover, when this covering layer SM is formed with an insulator, it is also becomes possible to use the upper part and the lower part of the word line WL independently.

Figure 32:
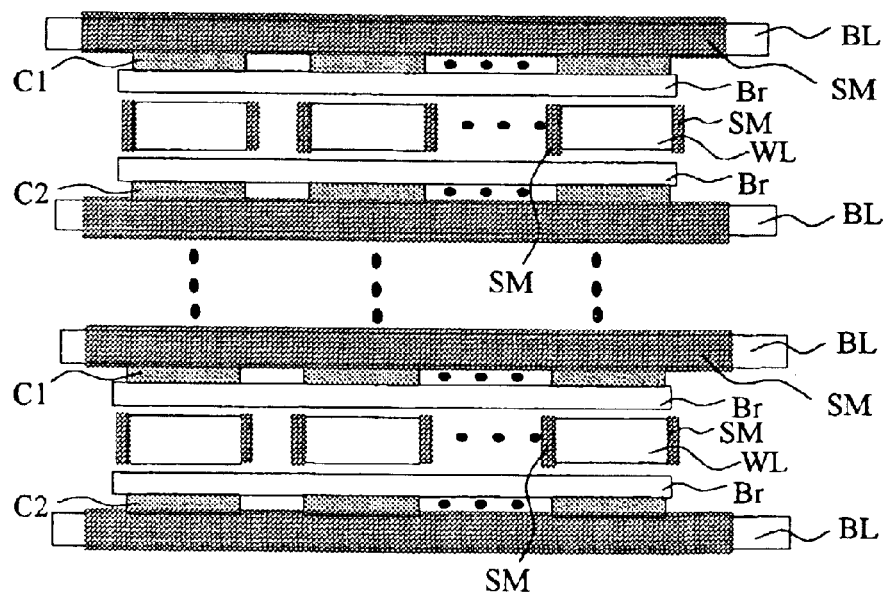
Figure 33:
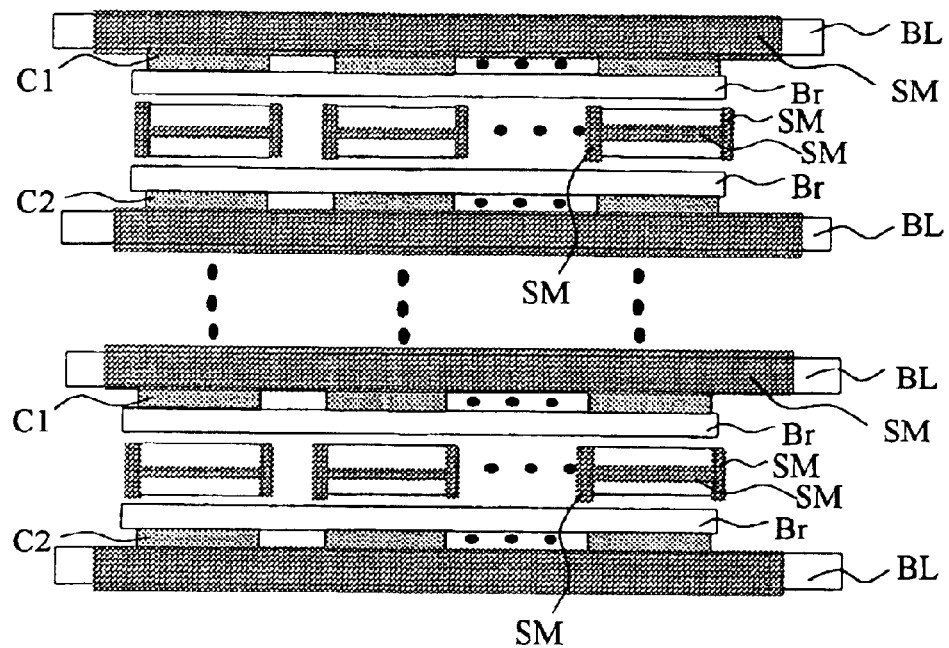

Next, FIGS. 32 and 33 show the structures where the laminating of the architecture mentioned above with regard to FIGS. 21 through 22B is carried out. In the case of the example of FIG. 32, since the write-in word line WL is used in common to the magnetoresistance effect elements C1 and C2 of the upper and lower sides, the covering layer SM is formed only in the sides. Also in this case, it becomes possible to perform a stable recording and reproducing by giving the uniaxial anisotropy of the lengthwise direction of the wiring to the covering layer SM.

On the other hand, in the case of the example shown in FIG. 33, the covering layer SM is inserted in the word line WL. This covering layer SM intercepts the write-in magnetic field generated from the upper and lower bit lines BL, and has the role to reduce the write-in cross talk between the upper and lower sides thereof.

Moreover, when this covering layer SM is formed with an insulator, it is also possible to use these upper part and the lower part of the word line WL independently.

Figure 34:
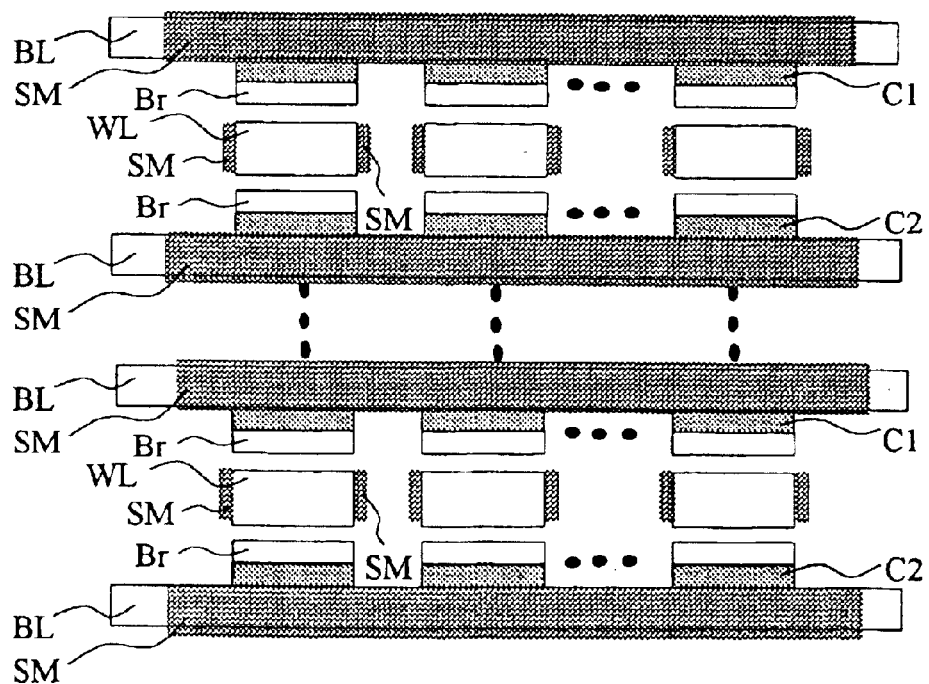
Figure 35:
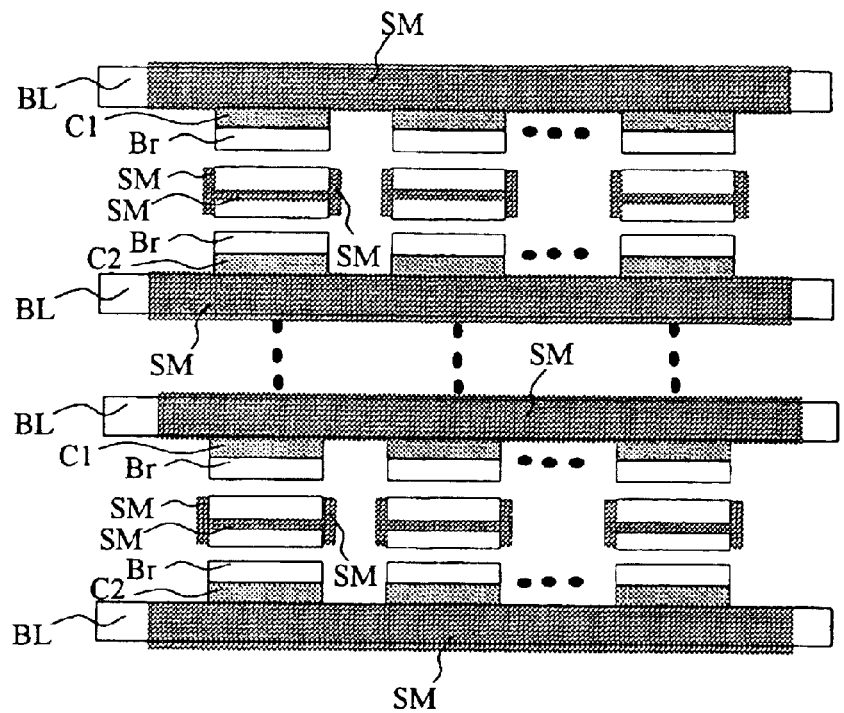

Next, FIGS. 34 and 35 show the structure where the laminating of the architecture mentioned above with regard to FIGS. 23 through 24B is carried out. In the case of the example of FIG. 34, since the write-in word lines WL are used in common to the magnetoresistance effect elements C1 and C2 of the upper and lower sides, the covering layer SM is formed only in the sides.

Also in this case, it becomes possible to perform a stable recording and reproducing by giving the uniaxial anisotropy of the lengthwise direction of the wiring to the covering layer SM.

On the other hand, in the case of the example shown in FIG. 35, the covering layer SM is inserted in the word line WL. This covering layer SM intercepts the write-in magnetic field generated from the upper and lower bit lines BL, and has the role to reduce the write-in cross talk between the upper and lower sides thereof.

Moreover, when this covering layer SM is formed with an insulator, it is also possible to use these upper part and the lower part of the word line WL independently.

Figure 36:
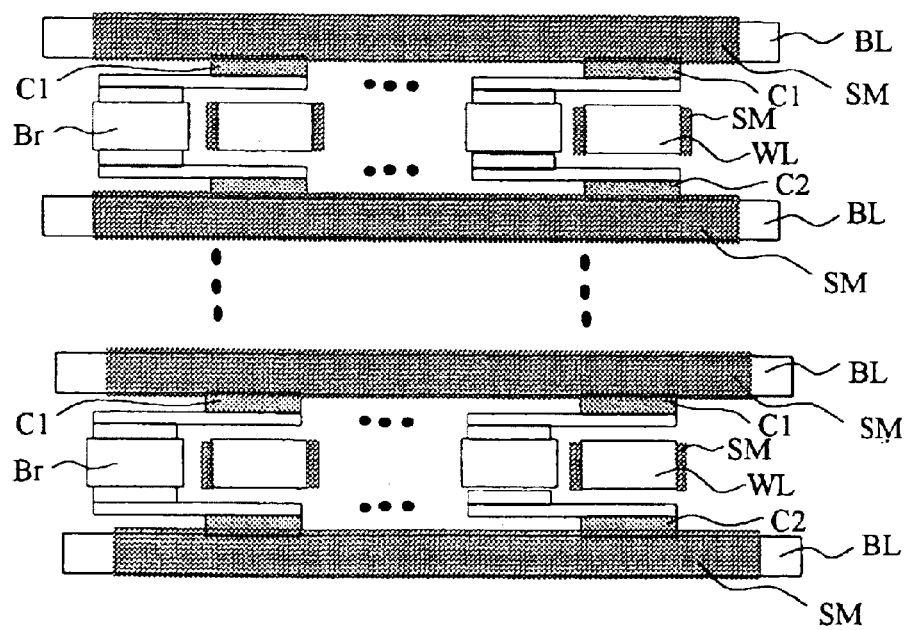
Figure 37:
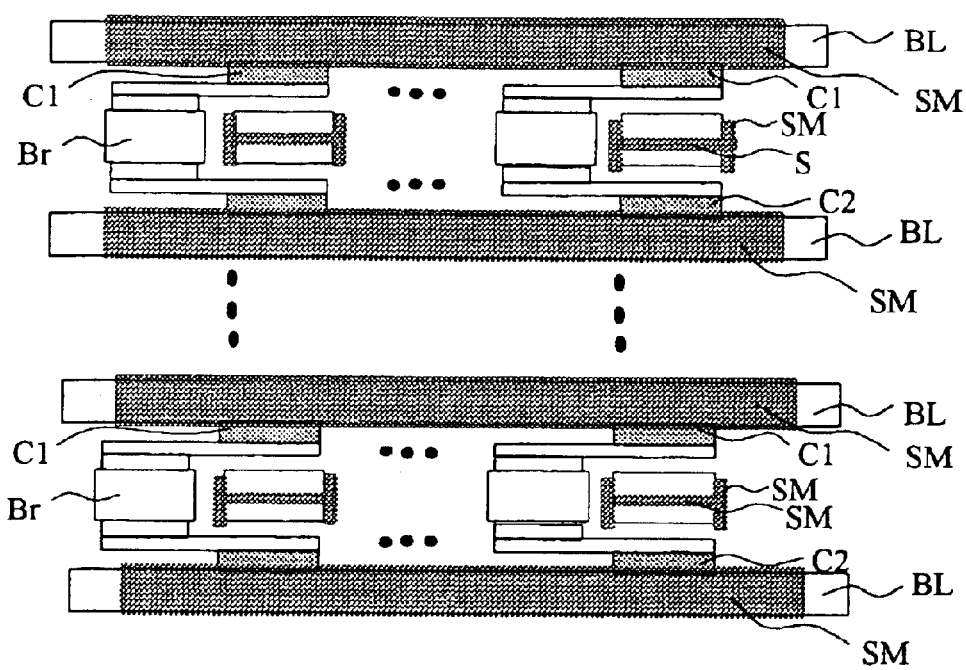

Next, FIGS. 36 and 37 show the structure where the laminating of the architecture mentioned above with regard to FIGS. 26 through 27B is carried out. In the case of the example of FIG. 36, since the write-in word lines WL are used in common to the magnetoresistance effect elements C1 and C2 of the upper and lower sides, the covering layer SM is formed only in the sides.

Also in this case, it becomes possible to perform a stable recording and reproducing by giving the uniaxial anisotropy of the lengthwise direction of the wiring to the covering layer SM. On the other hand, in the case of the example shown in FIG. 37, the covering layer SM is inserted in the word line WL. This covering layer SM intercepts the write-in magnetic field generated from the upper and lower bit lines BL, and has the role to reduce the write-in cross talk between the upper and lower sides thereof.

Moreover, when this covering layer SM is formed with an insulator, it is also possible to use these upper part and the lower part of the word line WL independently.

As mentioned above, the further large scale-integration becomes possible, by employing the laminating type structure as illustrated in FIGS. 30 through 37. Moreover, in the case of these laminated structures, the same effect can be attained as mentioned above with regard to FIGS. 1A through 8B according to the embodiment.

EXAMPLES

Hereafter, some of the embodiment of the invention will be explained in greater detail referring to some examples.

First Example

First, as a first example of the invention, a magnetic memory which has 10×10 TMR cells was fabricated on the basis of the memory array of the simple matrix structure shown in FIGS. 23 through 24B along with some comparative structures. It will be as the following if the structure of this magnetic memory is explained along with the manufacture procedure.

First, on a substrate which is not illustrated, the lower bit line BL was formed with the covering layer SM which consists of nickel iron (NiFe) formed by a plating method. Here, the main part of the wiring was made into the electric conductive layer with a thickness of 1 micrometer made of copper (Cu). After that, an insulating layer was formed by a CVD method, then CMP (Chemical Mechanical Polishing) was performed to obtain a flat surface. Then, the laminating structure of TMR which has a ferromagnetic double tunnel junction was deposited by a sputtering method.

The material and the thickness of each layer from the lower side are as the following:

Ta (30 nm)/Ru (3 nm)/Ir—Mn (8 nm)/CoFe (3 nm)/Ru (1 nm)/CoFe (3 nm)/AlOx (1 nm)/CoFeNi (2 nm)/Cu (1.5 nm)/CoFeNi (2 nm)/AlOx (1 nm)/CoFe (3 nm)/Ru (1 nm)/CoFe (3 nm)/IrMn (8 nm)/Ta (9 nm)/Ru (30 nm).

Next, isolated patterns of TMR elements were produced by etching the laminating structure to the lower Ru/Ta wiring layer by RIE (Reactive Ion Etching) using the etching gas of a chlorine system, and by using the top Ru layer as a hard mask.

Then, after depositing SiOx by the low-temperature TEOS (tetra ethyl ortho silicate) process as an insulator and polishing the surface by CMP, the read-out bit line Br was formed by deposition and patterning process.

Then, after forming an interlayer insulation film by the similar method and performing a planarizing process, the word line WL was formed and the covering layer SM was further formed thereon by a plating method.

In this example, thickness of the covering layer SM was set to 0.01 micrometers–0.06 micrometers. And the length of the shorter axis of a TMR element was set to 0.25 micrometers, and length of the longer axis of the TMR was made to change in the range of 0.3 micrometers–0.8 micrometers. Moreover, the length of L3 (expressed by FIG. 2) was made into a length of +0.15 micrometers to the length of TMR.

One example to fabricate the projecting section P which projects below the wiring WL is as follows:

That is, after forming the wiring WL, trenches may be formed in the insulated layer at the both sides of the wiring WL, then metal seed layer may be deposited on the inner wall of the trench by a sputtering, and finally the projecting section P may be formed on the seed layer to embed the trench by a plating method.

In this example, samples where the length L1 (shown in FIG. 2) of the covering layer SM of the upper word line WL and the lower word line WL was changed by within the range from the length of the longer axis of TMR to 2.0 micrometers were produced.

When L1 is 2.0 micrometers, the adjoining covering layers SM are connected completely and they are unified. The length L2 (shown in FIG. 2) of the perpendicular direction of the covering layer SM of the word line WL was set to 0.2 micrometers.

Then, the samples were introduced into the heat treatment furnace which can apply a magnetic field, thus a uniaxial anisotropy was introduced into the magnetic-recording layer of a TMR element, and unidirectional anisotropy was introduced into the magnetic pinned layer. Since the materials (nickel iron, cobalt iron nickel, or cobalt nickel) having the crystal magnetic anisotropy constant K1 (primary term) not higher than $5 \times 10^4$ erg/cc were used as the materials of the covering layer SM, a uniaxial anisotropy was successfully obtained by the annealing.condition for the TMR element (for example, 7000 gauss, 300 degrees C., 1 hour).

Thus, using the magnetic memories of this example, the TMR signal output after writing in 10 times was measured, the "1" levels and "0" levels of a TMR element were reversed by the checkered flag pattern, then existence of defect of operation was investigated. At that time, current value and pulse width of a write-in current pulse were optimized so that a cross talk becomes smallest.

These results are shown in FIGS. 38 through 41 as tables. These results show that a defect of operation is not observed when the crystal magnetic anisotropy constant K1 (primary term) of the material of the covering layer SM is not higher than $5 \times 10^4$ erg/cc, since a uniaxial anisotropy is introduced thereto by a form effect, and good results are acquired. Here, L2 is set to 0.2 microns for all samples.

That is, this example shows that there is no defect of operation, when the thickness of a magnetic covering layer is thinner than 0.06 micrometers, and especially when L1>1 micrometer□(2L2+L3).

Moreover, the results of the case where FeMn (thickness of 8 nm) and IrMn (thickness of 4 nm) were added through Cu (thickness of 0.5 nm) to each wirings of the above-mentioned samples are shown in FIGS. 42 through 44 as tables.

It turned out that when an anti-ferromagnetic film is given, a defect of operation decreases remarkably and a more desirable effect is acquired as compared with FIGS. 38 through 41.

Moreover, as an example of comparison, the Inventors made the magnetic memories using the cobalt iron alloy (Co90Fe10) whose crystal magnetic anisotropy constant K1 (primary term) is $1 \times 10^5$ erg/cc as a material of the covering layer SM, and investigated the operation thereof.

FIGS. 45 and 46 are tables showing the results of this example of comparison. Also in the structures where a defect of operation was not seen in FIGS. 40 and 41, the defect of operation has occurred in FIG. 45 and FIG. 46. Thus, when the materials having the crystal magnetic anisotropy constant K1 (primary term) of $1 \times 10^5$ erg/cc, it turns out that a uniaxial anisotropy due to a form effect becomes unstable in the covering layer SM, and operation becomes poor.

Second Example

Next, as a second example of the invention, a magnetic memory which has 10×10 TMR cells was fabricated on the basis of the memory array of the simple matrix structure shown in FIGS. 26 through 27B along with some comparative structures.

It will be as the following if the structure of this magnetic memory is explained along with the manufacture procedure.

First, on a substrate which is not illustrated, the lower bit line BL was formed with the covering layer SM which consists of nickel iron (NiFe) formed by a plating method. Here, the main part of the wiring was made into the electric conductive layer with a thickness of 1 micrometer made of copper (Cu).

After that, an insulating layer was formed by a CVD method, via holes were formed therethrogh, tungsten electrodes were embedded in these via holes, then CMP (Chemical Mechanical Polishing) was performed to obtain a flat surface.

Then, the laminating structure of TMR which has a contact wiring Mx and a ferromagnetic double tunnel junction was deposited by a sputtering method.

The material and the thickness of each layer from the lower side are as the following:

Ta (30 nm)/Ru (3 nm)/Pt—Mn (12 nm)/CoFe (3 nm)/Ru (3 nm)/AlOx (1 nm)/CoFeNi (2 nm)/Ru (1.5 nm)/ CoFeNi (2 nm)/AlOx (1 nm)/CoFe (3 nm)/Ru (1 nm)/ CoFe (3 nm)/Pt—Mn (12 nm)/Ta (9 nm)/Ru (30 nm).

Next, isolated patterns of TMR elements were produced by etching the laminating structure to the lower Ru/Ta wiring layer by RIE (Reactive Ion Etching) using the etching gas of a chlorine system, and by using the top Ru layer as a hard mask.

Then, after depositing SiOx by the low-temperature TEOS (tetra ethyl ortho silicate) process as an insulator and polishing the surface by CMP, the read-out bit line Br was formed by deposition and patterning process.

Then, after forming an interlayer insulation film by the similar method and performing a planarizing process, the word line WL was formed and the covering layer SM was further formed thereon by a plating method.

In this example, thickness of the covering layer SM was set to 0.01 micrometers–0.06 micrometers. And the length of the shorter axis of a TMR element was set to 0.25 micrometers, and length of the longer axis of the TMR was made to change in the range of 0.3 micrometers–0.8 micrometers.

Moreover, the length of L3 (expressed by FIG. 2) was made into a length of plus 0.15 micrometers to the length of TMR.

In this example, samples where the length L1 (shown in FIG. 2) of the covering layer SM of the upper word line WL and the lower word line WL was changed by within the range from the length of the longer axis of TMR to 2.0 micrometers were produced.

When L1 is 2.0 micrometers, the adjoining covering layers SM are connected completely and they are unified. The length L2 (shown in FIG. 2) of the perpendicular direction of the covering layer SM of the word line WL was set to 0.2 micrometers.

Then, the samples were introduced into the heat treatment furnace which can apply a magnetic field, thus a uniaxial anisotropy was introduced into the magnetic-recording layer of a TMR element, and unidirectional anisotropy was introduced into the magnetic pinned layer.

Thus, using the magnetic memories of this example, the TMR signal output after writing in 10 times was measured, the "1" levels and "0" levels of a TMR element were reversed by the checkered flag pattern, then existence of defect of operation was investigated. At that time, current value and pulse width of a write-in current pulse were optimized so that a cross talk becomes smallest.

These results are shown in FIGS. 47 through 50 as tables. These results show that a defect of operation is not observed when the uniaxial anisotropy is introduced in the covering layer SM by a form effect, and good results are acquired.

That is, this example shows that there is no defect of operation, when the thickness of a magnetic covering layer is thinner than 0.06 micrometers, and especially when L1>1 micrometer□ (2L2+L3). Here, L2 is set to 0.2 microns for all samples.

Moreover, as an example of comparison, the Inventors made the magnetic memories using the cobalt iron alloy ($Co_{90}Fe_{10}$) whose crystal magnetic anisotropy constant K1 (primary term) is $1\times10^5$ erg/cc as a material of the covering layer SM, and investigated the operation thereof.

FIGS. 51 and 52 are tables showing the results of this example of comparison. Also in the structures where a defect of operation was not seen in FIGS. 49 and 50, the defect of operation has occurred in FIG. 51 and FIG. 52. Thus, when the materials having the crystal magnetic anisotropy constant K1 (primary term) of $1\times10^5$ erg/cc, it turns out that a uniaxial anisotropy due to a form effect becomes unstable in the covering layer SM, and operation becomes poor.

Moreover, the results of the case where FeMn (thickness of 6 nm) and IrMn (thickness of 5 nm) were added through Cu (thickness of 0.7 nm) to each wirings of the above-mentioned samples are shown in FIGS. 53 through 55 as tables. It turned out that when an anti-ferromagnetic film is given, a defect of operation decreases remarkably and a more desirable effect is acquired.

Heretofore, some embodiments of the invention have been explained with reference to specific examples. The invention, however, is not limited to these specific examples. For example, the invention contemplates in its own cope all alternatives concerning materials, thicknesses, shapes, sizes, etc. of the covering layer, wirings, ferromagnetic layer, insulating film, anti-ferromagnetic layer, nonmagnetic metal layer, electrode that are components of the switching elements and/or magnetoresistance effect element as far as persons skilled in the art can appropriately select them and can practically use the invention to obtain substantially the same effects.

Similarly, the invention contemplates in its own scope all alternatives concerning structures, materials, shapes and sizes of the bit line, digit line, word line, overcoat layer, selection transistor, diode and other composing the magnetic memory according to any embodiment of the invention as far as persons skilled in the art can appropriately select them and can practically use the invention to obtain substantially the same effects.

Further, the invention contemplates in its scope all magnetic heads including a lateral recording head and a vertical recording head that persons skilled in the art can make by modifying the magnetic memories shown here as embodiments of the invention.

Furthermore, the invention contemplates in its scope all magnetic memories that persons skilled in the art can make by modifying the magnetic memories shown here as embodiments of the invention.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A magnetic memory comprising:

a first magnetoresistance effect element having a magnetic recording layer;

a first wiring extending in a first direction on or below the first magnetoresistance effect element;

a covering layer provided on at least both sides of the first wiring, the covering layer being made of magnetic material, and a condition L1>(2L2+L3) being satisfied where L1 is a length of the covering layer along a lengthwise direction of the first wiring, L2 is a width of the covering layer provided on the both sides of the first wiring, and L3 is a width of the covering layer provided on an upper or lower side of the first wiring; and a writing circuit configured to pass a current through the first wiring in order to record information in the magnetic recording layer by a magnetic field generated by the current.

2. A magnetic memory according to claim 1, wherein the covering layer is provided on the upper or lower side of the first wiring.

3. A magnetic memory according to claim 2, wherein the covering layer is separately provided on the both sides of the first wiring and on the upper or lower side of the first wiring.

4. A magnetic memory according to claim 1, further comprising a second magnetoresistance effect element having a magnetic recording layer, and provided on or below the first wiring and the first magnetoresistance effect element, wherein the covering layer is provided on the both sides of the first wiring and another covering layer is inserted in the first wiring.

5. A magnetic memory according to claim 1,
wherein the covering layer is provided only on the both sides of the first wiring, L3 being zero.

6. A magnetic memory according to claim 1, wherein a layer made of an antiferromagnetic material is laminated with the covering layer.

7. A magnetic memory according to claim 1, wherein the covering layer includes a material selected from the group consisting of,
(1) a nickel-iron alloy,
(2) a cobalt-nickel alloy,
(3) a cobalt-iron-nickel alloy,
(4) an alloy of cobalt and at least one of zirconium, hafnium, niobium, tantalum and titanium,
(5) an amorphous alloy of a (Co, Fe, Ni)—(Si, B)—(P, Al, Mo, Nb, Mn)-system,
(6) a nano-granular metal-nonmetal material of a (Fe, Co)—(B, Si, Hf, Zr, Sm, Ta, Al)—(F, O, N)-system, and
(7) an insulative ferrite.

8. A magnetic memory according to claim 1, further comprising a conductive layer adjoining an outer side of the covering layer of the first wiring and including a conductive nonmagnetic material.

9. A magnetic memory comprising:
a first wiring extending in a first direction;
a first magnetoresistance effect element provided on the first wiring and having a magnetic recording layer;
a second wiring provided on the first magnetoresistance effect element and extending in a direction across the first direction;
a covering layer provided on at least both sides of at least one of the first and second wirings, the covering layer being made of magnetic material, and a condition L1>(2L2+L3) being satisfied where L1 is a length of the covering layer alone a lengthwise direction of the one of the first and second wirings, L2 is a width of the covering layer provided on the both sides of the first wiring, and L3 is a width of the covering layer provided on an upper or lower side of the first wiring; and
a writing circuit configured to pass currents through the first and second wirings in order to record one of two values of two-valued information in the magnetic recording layer by magnetic fields generated by the currents.

10. A magnetic memory according to claim 9, wherein the covering layer is provided on the upper or lower side of the one of the first and second wirings.

11. A magnetic memory according to claim 9, wherein the covering layer is separately provided on the both sides of the one of the first and second wirings and on the upper or lower side of the one of the first and second wirings.

12. A magnetic memory according to claim 9,
wherein the covering layer is provided only on the both sides of the second wiring, L3 being zero.

13. A magnetic memory according to claim 9, further comprising a second magnetoresistance effect element having a magnetic recording layer, and provided on the second wiring and the first magnetoresistance effect element,
wherein the covering layer is provided on the both sides of the second wiring and another covering layer is inserted in the second wiring.

14. A magnetic memory according to claim 9,
wherein a layer made of an antiferromagnetic material is laminated with the covering layer.

15. A magnetic memory according to claim 9, wherein the covering layer includes a material selected from the group consisting of,
(1) a nickel-iron alloy,
(2) a cobalt-nickel alloy,
(3) a cobalt-iron-nickel alloy,
(4) an alloy of cobalt and at least one of zirconium, hafnium, niobium, tantalum and titanium,
(5) an amorphous alloy of a (Co, Fe, Ni)—(Si, B)—(P, Al, Mo, Nb, Mn)-system,
(6) a nano-granular metal-nonmetal material of a (Fe, Co)—(B, Si, Hf, Zr, Sm, Ta, Al)—(F, O, N)-system, and
(7) an insulative ferrite.

16. A magnetic memory comprising:
a first wiring extending in a first direction;
a first magnetoresistance effect element provided on the first wiring and having a magnetic recording layer;
a second wiring provided on the first magnetoresistance effect element and extending in a direction across the first direction;
a covering layer provided on at least both sides of at least one of the first and second wirings, the covering layer being made of magnetic material, and a condition L1>(2L2+L3) being satisfied where L1 is a length of the covering layer along a lengthwise direction of the one of the first and second wirings, L2 is a width of the covering layer provided on the both sides of the first wiring, and L3 is a width of the covering layer provided on an upper or lower side of the first wiring;
a conductive layer adjoining an outer side of the covering layer taken from the adjoining wiring and being made of a conductive nonmagnetic material; and
a writing circuit configured to pass currents through the first and second wirings in order to record one of two values of two-valued information in the magnetic recording layer by magnetic fields generated by the currents.

17. A magnetic memory according to claim 16, wherein the covering layer is provided on the upper or lower side of the one of the first and second wirings.

18. A magnetic memory according to claim 16, wherein the covering layer is separately provided on the both sides of the one of the first and second wirings and on the upper or lower side of the one of the first and second wirings.

19. A magnetic memory according to claim 16,
wherein the covering layer is provided only on the both sides of the second wiring, L3 being zero.

20. A magnetic memory according to claim 16, further comprising a second magnetoresistance effect element having a magnetic recording layer, and provided on the second wiring and the first magnetoresistance effect element,
wherein the covering layer is provided on the both sides of the second wiring and another covering layer is inserted in the second wiring.

* * * * *